(12) United States Patent
Suzuki et al.

(10) Patent No.: US 6,538,293 B2
(45) Date of Patent: Mar. 25, 2003

(54) SEMICONDUCTOR INTEGRATED CIRCUIT DEVICE AND METHOD OF MANUFACTURING THE SAME

(75) Inventors: Kazuhisa Suzuki, Hamura (JP); Toshiro Takahashi, Hamura (JP); Yasunobu Yanagisawa, Odawara (JP); Yusuke Nonaka, Tachikawa (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/142,062

(22) Filed: May 10, 2002

(65) Prior Publication Data
US 2002/0130342 A1 Sep. 19, 2002

Related U.S. Application Data

(63) Continuation of application No. 09/661,372, filed on Sep. 13, 2000, now Pat. No. 6,433,398.

(30) Foreign Application Priority Data

Sep. 13, 1999 (JP) .............................. 11-259460

(51) Int. Cl.[7] .............................. H01L 31/119
(52) U.S. Cl. .................. 257/392; 257/300; 257/371; 257/391; 257/402
(58) Field of Search ................... 257/392, 300, 257/371, 391, 402, 296

(56) References Cited

U.S. PATENT DOCUMENTS

| | | | |
|---|---|---|---|
| 4,651,406 A | 3/1987 | Shimizu et al. | |
| 5,723,355 A | 3/1998 | Chang et al. | |
| 5,847,432 A | 12/1998 | Nozaki | |
| 6,376,316 B2 * | 4/2002 | Shukuri et al. | 438/275 |

FOREIGN PATENT DOCUMENTS

| JP | 61-232656 | 10/1986 |
|---|---|---|
| JP | 05235289 | 9/1993 |

* cited by examiner

Primary Examiner—Jasmine J B Clark
(74) Attorney, Agent, or Firm—Antonelli, Terry, Stout & Kraus, LLP

(57) ABSTRACT

A capacitive element $C_1$ having a small leakage current is formed by utilizing a gate oxide film 9B thicker than that of a MISFET of a logic section incorporated in a CMOS gate array, without increasing the number of steps of manufacturing the CMOS gate array. The capacitive element $C_1$ has a gate electrode 10E. A part of the gate electrode 10E is made of a polycrystalline silicon film. The polycrystalline silicon film is doped with n-type impurities, so that the capacitive element may reliably operate even at a low power-supply voltage.

30 Claims, 27 Drawing Sheets

Vg-C characteristic of pMOS

Vg-C characteristic of Nmos

Chip area : Large    Power consumed in circuit : Large

Chip area : Small   Power consumed in circuit : Small

SEMICONDUCTOR INTEGRATED CIRCUIT DEVICE AND METHOD OF MANUFACTURING THE SAME

This application is a continuation of U.S. application Ser. No. 09/661,372 filed on Sep. 13, 2000, the entire disclosure of which is h incorporated by reference. Now U.S. Pat. No. 6,433,398.

TECHNICAL FIELD OF THE INVENTION

The present invention relates to a semiconductor integrated circuit device and a method of manufacturing the same. More particularly, the invention relates to a technique that is effective and useful when applied to a semiconductor integrated circuit device that has capacitive elements, each comprising a MISFET (Metal Insulator Semiconductor Field Effect Transistor).

BACKGROUND OF THE INVENTION

A method is known in which capacitive elements are formed in an LSI comprising MISFETs that compose circuits, by utilizing the gate oxide films of the MISFETS. To use the capacitance of the gate oxide film of each MISFET, the storage region of a p-channel MISFET or the inversion region of an n-channel MISFET is utilized.

The Japanese Patent Application Laid-open Publication No. 61-232656 discloses the technique of forming a MOS-type capacitive element at the same time the thin gate oxide film of a nonvolatile memory element is formed, thereby to reduce the area of the MOS-type capacitive element. This technique has been devised in view of the fact that the electrode of a MOS-type capacitive element is necessarily large if the insulating film of the MOS-type capacitive element is formed at the same time the gate oxide film of an ordinary MOSFET is formed, because the gate oxide film of the MOSFET is relatively thick.

The Japanese Patent Application Laid-Open Publication No. 5-235289 discloses an LSI in which the MOS-type capacitive elements are used in an inversion region over the entire input voltage range by controlling the threshold voltage (Vth) of the MOS-type capacitive elements. The LSI has been proposed in consideration of the fact that a conventional MOS-type capacitive element that uses the storage region has its operating characteristic greatly influenced if the operating power-supply voltage is lowered as required to minimize the power the LSI consumes.

SUMMARY OF THE INVENTION

In recent years, MISFETs have been made smaller and smaller. The gate oxide film of each MISFET is decreasing to 3 $\mu$m or less. If the gate oxide film thickness continues to decrease, however, the leakage current will noticeably increase due to the defects in the gate oxide film or directly due to the tunnel current. Consequently, the gate oxide film may not be able to provide stable capacitance if used as a capacitive element.

Accordingly, an object of the present invention is to provide a technique of reducing the leakage current in a capacitive element that comprises the gate oxide film of a MISFET.

Another object of the invention is to provide a technique of forming a capacitive element having a small leakage current, without increasing the number of manufacturing steps.

Additional objects and novel features of the invention will be obvious from the description, which follows, and the drawings accompanying the present specification.

The representative embodiments of this invention will be briefly described as follows.

(1) A semiconductor integrated circuit device comprising: a first MISFET having a first gate insulating film; a second MISFET having a second insulating film thinner than the first gate insulating film; and a capacitive element constituted by the first MISFET.

(2) A method of manufacturing a semiconductor integrated circuit device, comprising the steps of:

(a) forming a first gate insulating film having a first thickness on first and second major-surface regions of a semiconductor substrate, and forming a second gate insulating film having a second thickness, smaller than the first thickness, on a third major-surface of the semiconductor substrate;

(b) forming a first conductive film including a silicon film, on the semiconductor substrate on which the first and second gate insulating films have been formed;

(c) introducing n-type impurities into a part of the silicon film and p-type impurities into another part of the silicon film;

(d) forming gate electrodes by patterning the first conductive film, thereby forming, in the first major-surface region, an n-channel MISFET having a gate electrode including an n-type silicon film and a p-channel MISFET having a gate electrode including a p-type silicon film, and forming, in the second major-surface region, a p-channel MISFET having a gate electrode including an n-type silicon film and constituting a capacitive element, and forming, in the third major-surface region, an n-channel MISFET having a gate electrode including an n-type silicon film and a p-channel MISFET having a gate electrode including a p-type silicon film.

Hence, the leakage current of the capacitive element constituted by a MISFET can be decreased since the MISFET has a thick gate insulating film.

Further, the capacitive element can have a high threshold voltage, because it is constituted by a p-channel MISFET having a gate electrode including an n-type silicon film. The capacitive element can therefore operate reliably even at a low power-supply voltage. In addition, special manufacturing steps need not be performed to increase the threshold voltage of the p-channel MISFET.

BRIEF DESCRIPTIONS OF THE DRAWINGS

Figure 27:
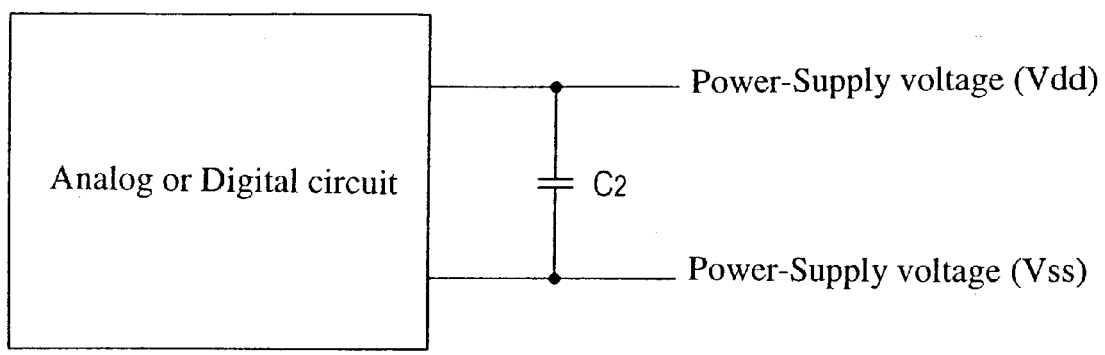
FIG. 27 is a diagram showing a capacitive element for stabilizing power-supply voltage, which is another embodiment of this invention.
Figure 28:
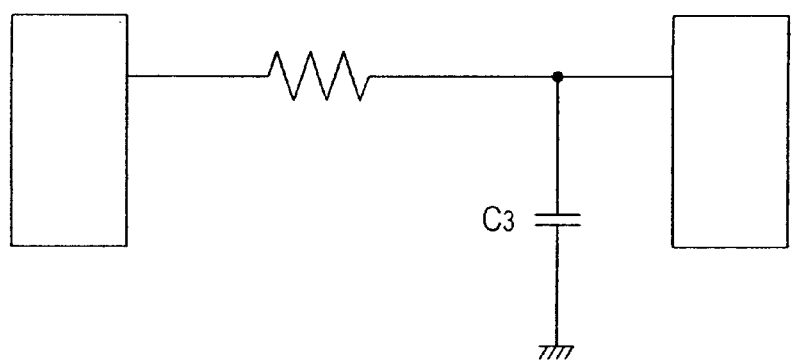

FIG. 28 is a diagram showing a filter capacitive element that is still another embodiment of the present invention; and FIG. 29($a$) is a diagram illustrating how a thin gate oxide film and a thick gate oxide film are used in accordance with the use of the capacitive element shown in FIG. 27, and 29($b$) is also a diagram illustrating how a thin gate oxide film and a thick gate oxide film are used in accordance with the use of the capacitive element shown in FIG. 27.

DESCRIPTION OF THE PREFERRED EMBODIMENTS

Embodiments of the present invention will be described in detail, with reference to the accompanying drawings. The components of each embodiment, which perform the same functions as those of other embodiments, are designated at the same reference numerals in the drawings. Such components will not be described repeatedly.

Embodiment 1

Figure 1:
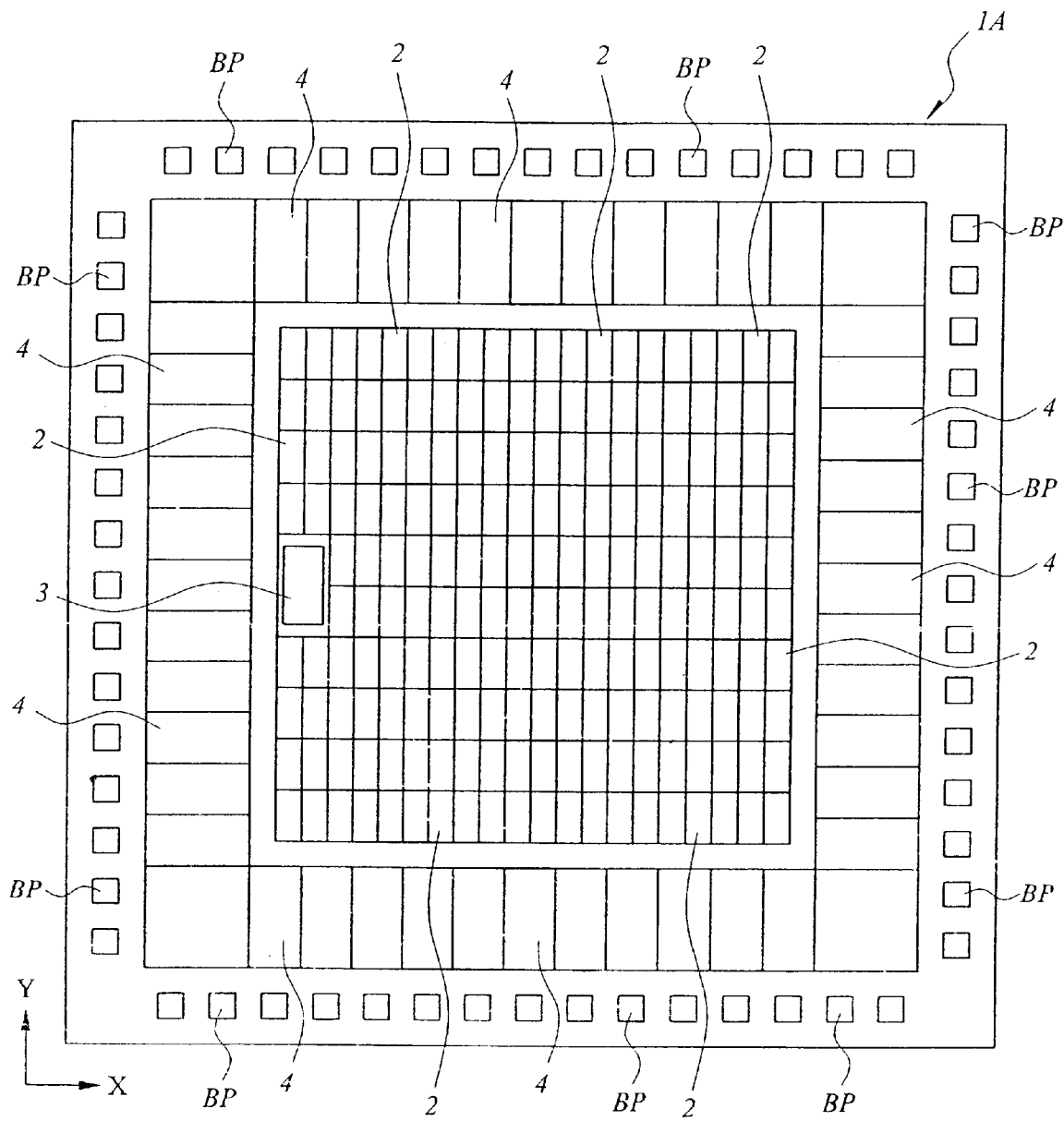
FIG. 1 is a plan view of a semiconductor chip, showing a CMOS gate array that is Embodiment I of the present invention.

The semiconductor integrated circuit according to Embodiment 1 is a CMOS (Complementary Metal Oxide Semiconductor) gate array. FIG. 1 shows the semiconductor chip IA incorporating the CMOS gate array.

As shown in FIG. 1, a number of fundamental cells 2 constituting the logic section of the CMOS gate array are arranged on the center part of the major surface of the semiconductor chip 1A made of single crystal silicon. More specifically, the cells 2 are arranged in rows (in X direction) and columns (in Y direction), forming a matrix. Each fundamental cell 2 is composed of n-channel MISFETs $Qn_1$ (not shown) and p-channel MISFETs $Qp_1$ (not shown). The MISFETs $Qn_1$, and $Qp_1$ are connected in each cell 2, and the cells 2 are connected to each other based on a logical design. Therefore, the CMOS gate array performs desired logic operations.

The connection for performing the above logic operations are made by means of a DA (Design Automation) system that employs, for example, CAD (Computer-Aided Design). First, the design automation system automatically lays logic circuits, each comprising macro cells and verified, on the semiconductor chip 1A. Then, the design automation system automatically lays connecting wires in a virtual X-Y coordinate lattice, thus connecting the logic circuits.

In the gate array according to Embodiment 1, the wires are arranged in, for example, seven layers. The wires in the first to sixth layers (i.e., signal lines and power supply lines) are made of metal made mainly of Cu (copper). The wires in the seventh layer (i.e., power-supply lines) are made chiefly of Al (aluminum).

Figure 2:
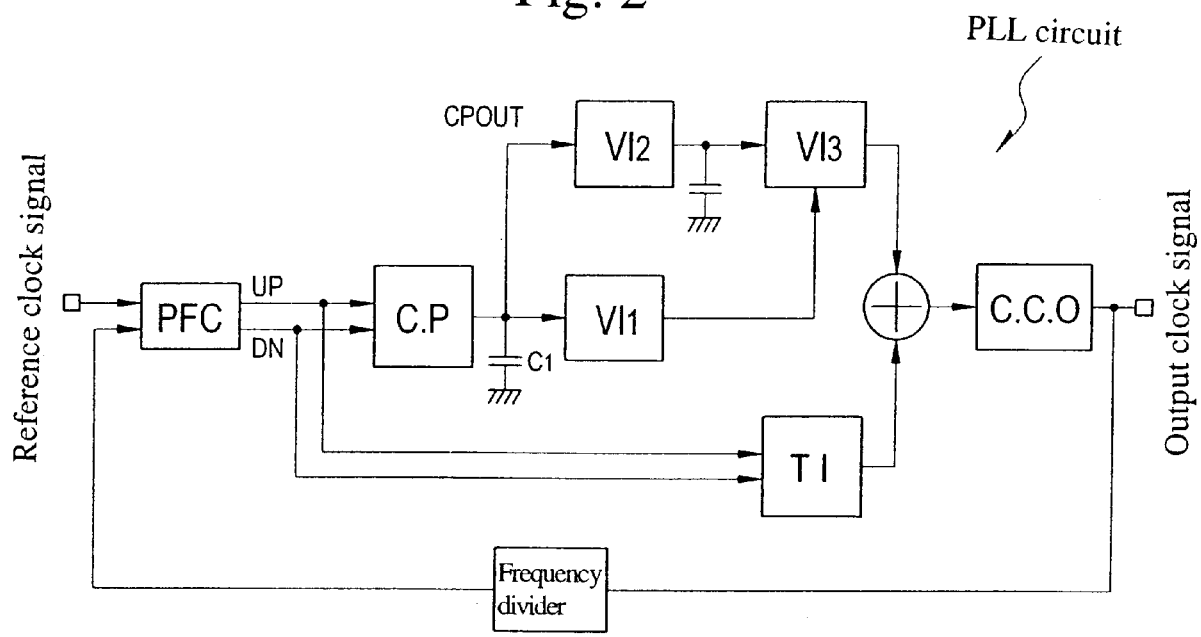
FIG. 2 is a diagram illustrating the analog PLL circuit incorporated in the CMOS gate array, i.e., Embodiment 1 of the invention.

An analog PLL (Phase-Locked Loop) circuit 3 is arranged at the periphery of the logic section. The PLL circuit 3 is designed to convert an externally supplied reference clock signal to a clock signal of a predetermined frequency, which is output to an internal circuit. As shown in FIG. 2, the PLL circuit 3 comprises a phase comparator PFC, a charge pump circuit CP, a voltage-current converting circuits $VI_1$ to $VI_3$, a time-current converting circuit Tl, an oscillator circuit CCO, and a frequency divider.

Figure 3:
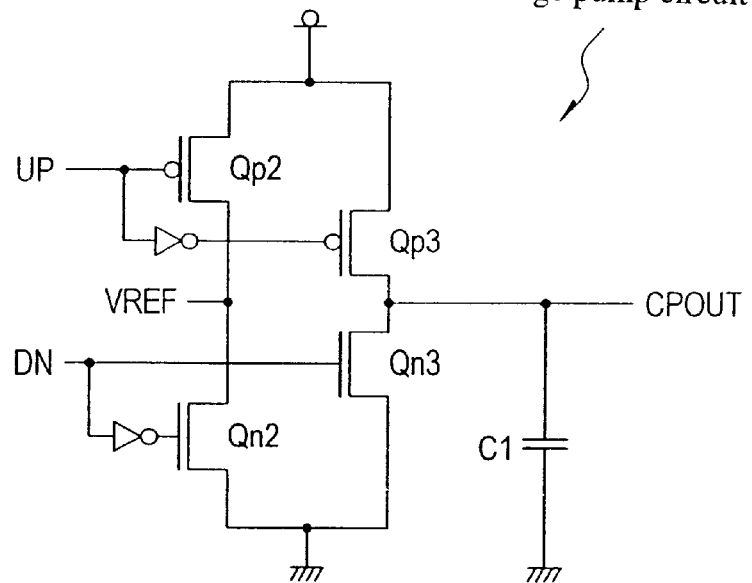
FIG. 3 is a circuit diagram of the charge pump circuit provided in the analog PLL circuit shown in FIG. 2.

The charge pump circuit CP provided in the PLL circuit 3 is, for example, as shown in FIG. 3, composed of two n-channel MISFETs $Qn_2$ and $Qn_3$, two p-channel MISFETs $QP_2$ and $QP_3$ and a capacitive element $C_1$. The ground potential GND (OV) is applied to one electrode of the capacitive element $C_1$. The other electrode of the capacitive element $C_1$ is electrically connected to the drains of the n-channel MISFET $Qn_3$ and p-channel MISFET $QP_3$. The drains of the n-channel MISFET $Qn_3$ and p-channel MISFET $QP_3$ are electrically connected to the inputs of the voltage-current converting circuits $VI_1$ and $VI_2$. The charge pump circuit CP outputs a charge that corresponds to the phase difference signal output from the phase comparator PFC. The capacitive element C, accumulates the charge outputted by the circuit CP, thereby generating a voltage of a predetermined level. The voltage thus generated is applied, as output voltage CPOUT, to the voltage-current converting circuits $VI_1$ and $VI_2$.

Figure 4A:
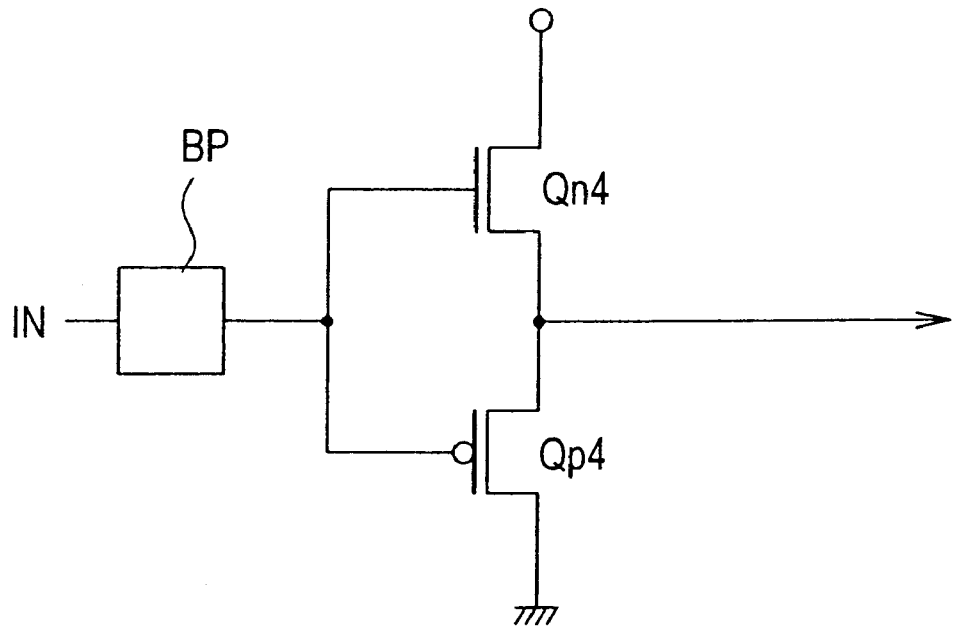
FIG. 4($a$) is a diagram showing an input buffer circuit for use in the CMOS gate array, i.e., Embodiment 1 of the invention, and FIG. 4($b$) is a diagram showing an output buffer circuit for use in the CMOS gate array.
Figure 4B:
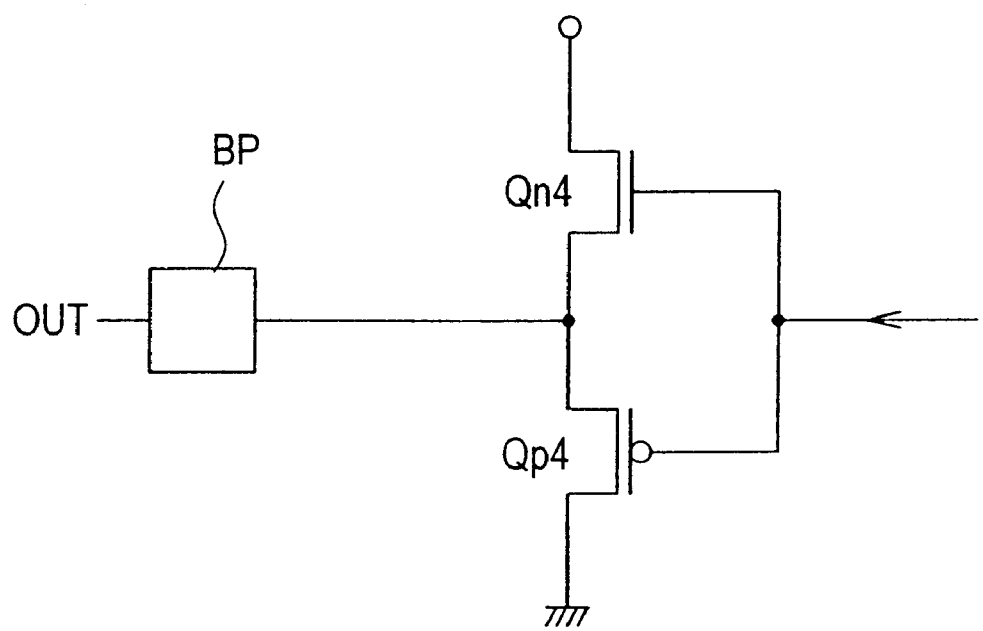

A plurality of input/output (I/O) buffer circuits 4 are arranged, surrounding the logic section. Each input/output buffer circuit 4 comprises a prescribed number of MISFET units, each composed of an n-channel MISFET $Qn_4$ and a p-channel MISFET $QP_4$. Due to the change of connection patterns, some of the MISFET units function as input buffer circuits, each having the structure shown in FIG. 4(a), some other MISFET units function as output buffer circuits, each having the structure shown in FIG. 4(b), and some other MISFET units function as bi-directional buffer circuits (not shown).

Bonding pads (external terminals) BP are arranged in a line on the four edge portions of the semiconductor chip 1A, for electrically connecting the semiconductor chip 1A to an external device. The bonding pads BP surround the input/output buffer circuits 4 such that each pad BP is located near one input/output buffer circuit 4 and electrically connected thereto by a wire (not shown).

Figure 5:
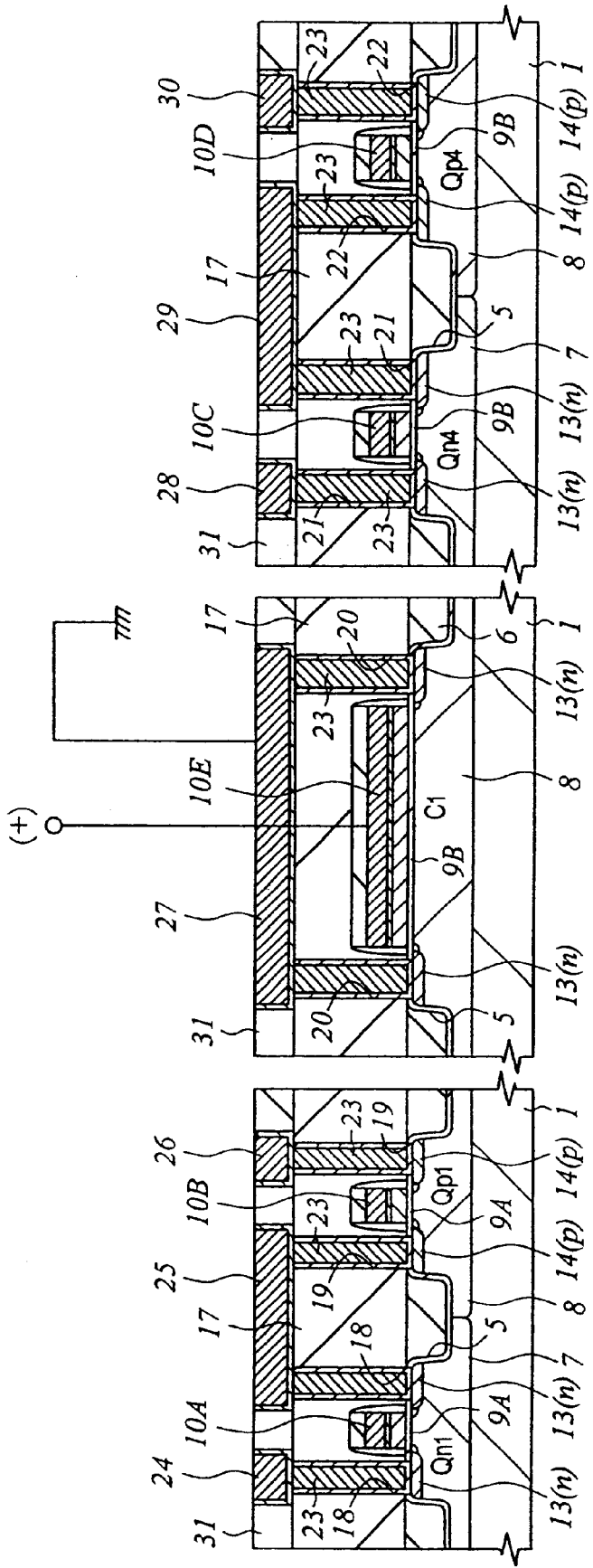
FIG. 5 is a sectional view of the semiconductor substrate, showing the CMOS gate array that is Embodiment 1 of the invention.

FIG. 5 is a sectional view showing parts of the semiconductor substrate 1 (hereinafter, referred to as "substrate) in which the CMOS gate array is formed. In the FIG. 5, the left part of the substrate 1 shows the MISFETs ($Qn_1$, $Qp_1$) constituting the fundamental cells 2, the middle part of the substrate 1 shows the capacitive element $C_1$ of the charge pump CP, and the right part of the substrate 1 shows the MISFET ($Qn_4$, $QP_4$) constituting the input/output buffer circuits 4.

Of the MISFETs ($Qn_1$, $Qp_1$) constituting the fundamental cells 2, each n-channel MISFET $Qn_1$ is provided in the p-type well 7 of the substrate 1. The n-channel MISFET $Qn_1$ is composed of mainly a gate oxide film 9A, a gate electrode 10A and n$^+$-type semiconductor regions (source and drain) 13. Each p-channel MISFET $Qp_1$ is provided in an n-type well 8 of the substrate 1 and composed of mainly a gate oxide film 9A, i.e., a gate insulating film, a gate electrode 10B, and p$^+$-type semiconductor regions (source and drain) 14.

The gate oxide film 9A of the MISFETs ($Qn_1$, $Qp_1$) are thin films (e.g., 2.5 nm to 3 nm thick) to increase the speed and efficiency of logic operations. The gate electrodes 10A and 10B of the MISFETs ($Qn_1$, $Qp_1$) are as short as possible with the existing process technology (for example, 0.14 μm long). The gate electrodes 10A and 10B have been made by depositing a barrier metal film such as WN film on a polycrystalline silicon film and a W (tungsten) film on the barrier metal film, thus forming a so-called "poly-metal film." The gate electrodes 10A and 10B therefore have a low resistance. The polycrystalline silicon film of the gate electrode 10A is doped with n-type impurities (e.g., arsenic, As), and the polycrystalline silicon film of the gate electrode 10B is doped with p-type impurities (boron, B). Thus, both gate electrodes 10A and 10B are of structure known as "dual gate structure."

Of the MISFETs ($Qn_4$, $QP_4$) constituting the input/output buffer circuits 4, each n-channel MISFET $Qn_4$ is provided in the p-type well 7 of the substrate 1. The n-channel MISFET $Qn_4$ is composed of mainly a gate oxide film 9B, i.e., a gate insulating film, a gate electrode 10C and n$^+$-type semiconductor regions (source and drain) 13. Each p-channel MIS-FET $QP_4$ is provided in an n-type well 8 of the substrate 1 and composed of mainly a gate oxide film 9B, a gate electrode 10D, and p$^+$-type semiconductor regions (source and drain) 14.

The MISFETs ($Qn_4$, $QP_4$) are made in accordance with design rules less strict than those of the MISFETs ($Qn_1$, $Qp_1$) constituting the fundamental cells 2. The MISFETs ($Qn_4$, $QP_4$), which are interface elements to be connected with the external device, operate at a voltage (e.g., 3.3 V) that is higher than the operating voltage (e.g., 1.5 V) of the MISFETs of the internal circuits. Therefore, the gate oxide films 9B of the MISFETs ($Qn_4$, $QP_4$) are relatively thick (e.g., 6.5 nm). Namely, the gate oxide films 9B are thicker than the gate oxide films 9A. The gate electrodes 10C and 10D of the MISFETs ($Qn_4$, $QP_4$) are poly-metal films and have dual gate structure, like the gate electrodes 10A and 10B of the MISFETs ($Qn_1$, $Qp_1$) that constitute the fundamental cells 2.

The capacitive element $C_1$ of the charge pump circuit CP is provided in the p-type well 8 of the substrate 1. The element $C_1$ is composed of mainly a gate oxide film 9B, a gate electrode 10E, and n$^+$-type semiconductor region 13. The semiconductor region 13 is provided to apply the ground potential (GND) to the n-type well 8. Thus, the capacitive element $C_1$ is a p-type MISFET. The n-type well 8 functions as one of the electrodes of the capacitive element $C_1$, while the gate electrode 10E functions as the other electrode of the capacitive element $C_1$. The gate oxide film 9B serves as the dielectric film of the capacitive element $C_1$. The capacitive element $C_1$ has a large area of about 1×10$^{-4}$ cm$^2$, in order to acquire electrostatic capacity of, for example, about 50 pF to 100 pF.

The oxide film 9B of the capacitive element $C_1$ is as thick as the gate oxide films 9B of the MISFETs ($Qn_4$, $QP_4$) constituting the input/output buffer circuit 4. (That is, the gate oxide film 9B of the capacitive element $C_1$ is, for example, about 6.5 nm thick.) The gate electrode 10E of the clement $C_1$ is a poly-metal film, like the gate electrodes 10A and 10B of the MISFETs ($Qn_1$, $Qp_1$) that constitute the fundamental cells 2 and the gate electrodes 10C and 10D of the MISFETs ($Qn_4$l $QP_4$) that constitute the input/output buffer circuits 4. Moreover, in order for the capacitive element $C_1$ to stably operate under a low voltage, the polycrystalline silicon film that is a part of the gate electrode 10E is doped with n-type impurities (e.g., As).

Figure 6:
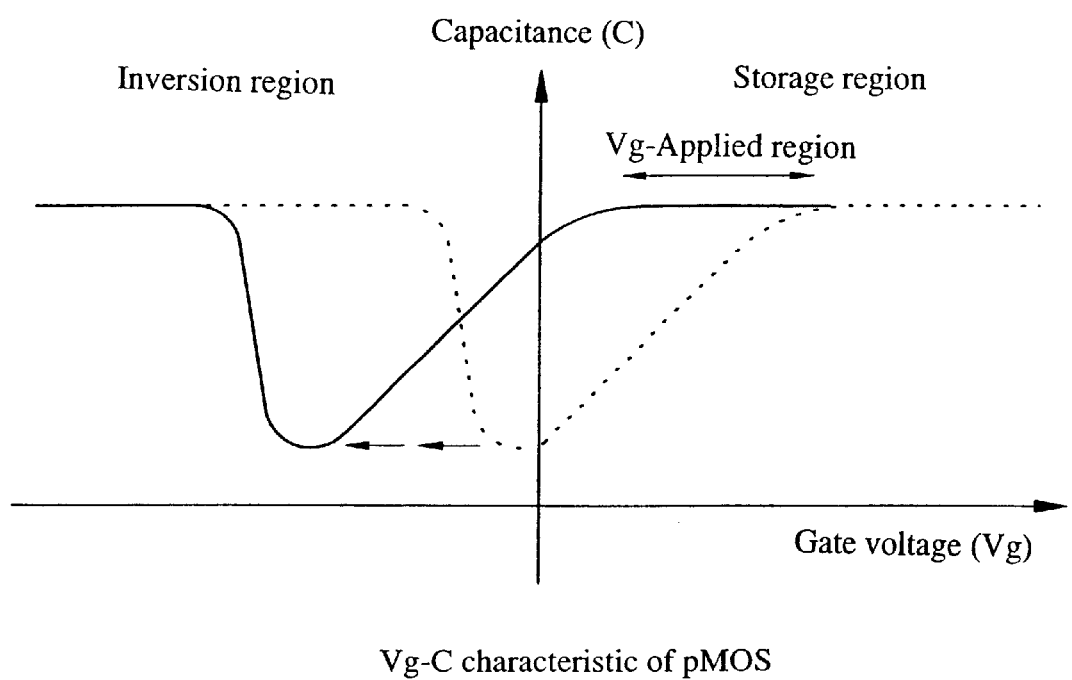
FIG. 6 is a graph representing the Vg-C characteristic of each capacitive element provided in the charge pump circuit shown in FIG. 2.

FIG. 6 is a graph representing the Vg-C characteristic of the capacitive element $C_1$ constituted by a p-channel MISFET.

The capacitive element $C_1$ has a gate oxide film 9B that is as thick as the gate oxide film 9B of the MISFETs ($Qn_4$, $QP_4$) constituting the input/output buffer circuits 4. The leakage current of the element $C_1$ is, therefore, smaller than that of a capacitive element which has a gate oxide film as thin as the gate oxide film 9A of the MISFETs ($Qn_1$, $Qp_1$) constituting the fundamental cells 2. The storage region of a p-channel MISFET may be used as a capacitive element. In this case, however, the capacitive element cannot have a stable capacitance in the low region of the gate input voltage as indicated by the broken line in FIG. 6. Hence, the polycrystalline silicon film that is a part of the gate electrode 10E is doped with n-type impurities (e.g., As), increasing the threshold voltage of the p-channel MISFET, in Embodiment 1 of this invention. This enables the capacitive element $C_1$ to acquire a stable capacitance in not only the high region of the gate input voltage but also the low region thereof, as indicated by the solid line in FIG. 6. As a result, the capacitance of the element can be stable in both the high region and low region of the output voltage (CPOUT) of the charge pump CP.

As shown in FIG. 5, two-layer insulating films, each composed of two silicon oxide films 17 and 31, are provided on the MISFETs ($Qn_1$, $Qp_1$, $Qn_4$, $QP_4$) and the capacitive element $C_1$, respectively. The silicon oxide films 17 have contact holes 18 to 22, respectively. In the contact holes 18 to 22 there are formed plug electrodes 23, on which first-layer wires 24 to 30 are provided. The plug electrodes 23 are made of barrier metal such as copper or TaN, or a film of tungsten or TiN. Six layers of wires are provided on the wires 24 to 30, interposing an interlayer insulating film therebetween, but such layers are not shown in the figures.

A method of manufacturing the CMOS gate array according to Embodiment 1 will be described, with reference to FIGS. 7 to 19.

Figure 7:
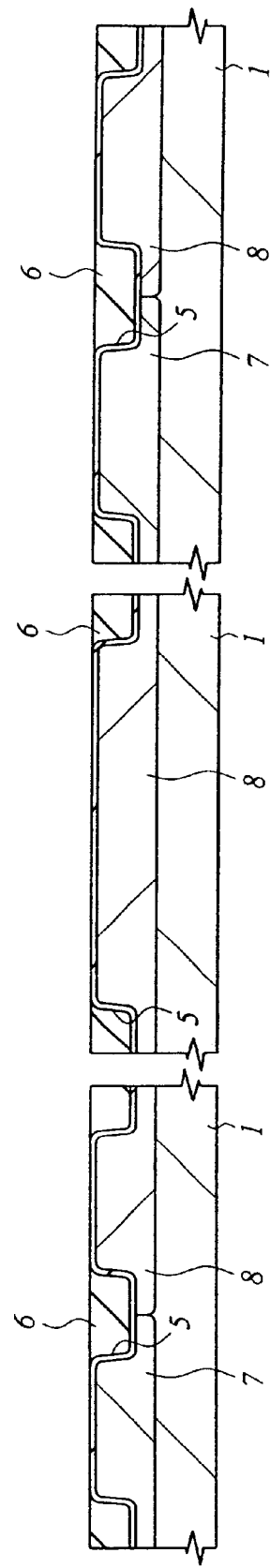
FIG. 7 is a sectional view of a semiconductor substrate, explaining a method of manufacturing the CMOS gate array, i.e., Embodiment 1 of the invention.

First, as shown in FIG. 7, element-isolating trenches 5 are made in the surface of the substrate 1. The trenches 5 are filled with, for example, silicon oxide films 6, thereby forming element-isolating regions. Next, n-type impurities (e.g., phosphorus, P) are ion-implanted into parts of the substrate 1 and p-type impurities (e.g., B) are ion-implanted into other parts of the substrate 1, by using a photoresist film (not shown) as a mask. Thereafter, the substrate 1 is heat-treated, diffusing the n-type impurities and the p-type impurities. P-type wells 7 and n-type wells 8 are thereby formed in the surface of the substrate 1.

Figure 8:
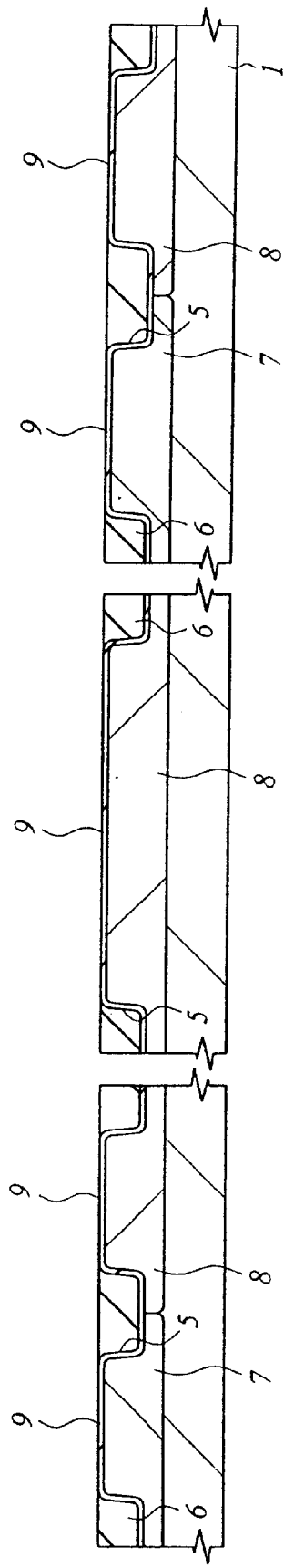
FIG. 8 is a sectional view of a semiconductor substrate, explaining a method of manufacturing the CMOS gate array, i.e., Embodiment 1 of the invention.
Figure 9:
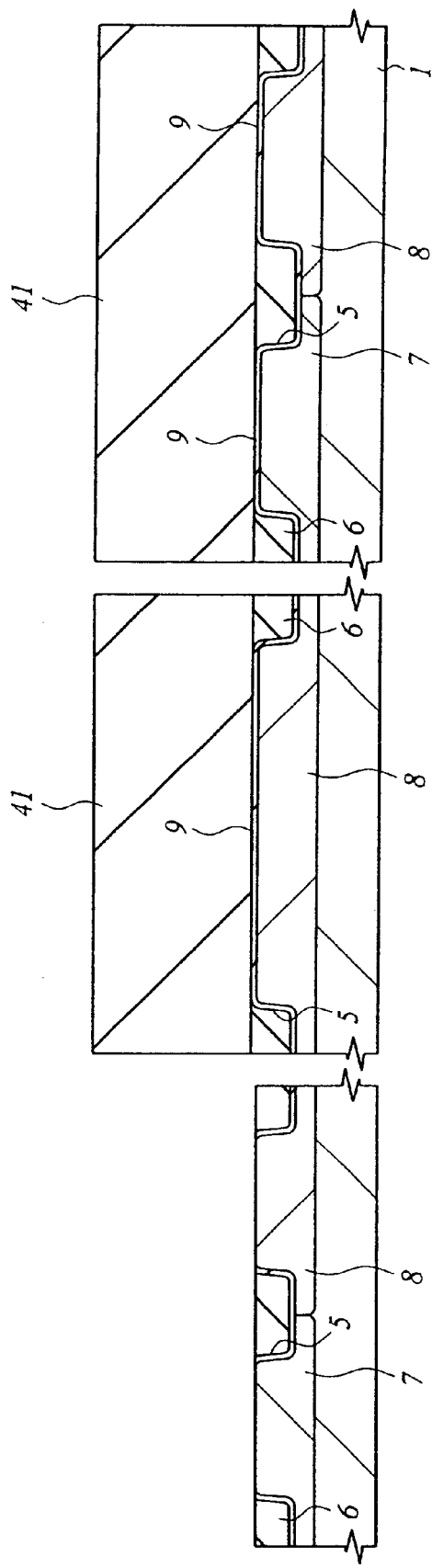
FIG. 9 is a sectional view of a semiconductor substrate, explaining a method of manufacturing the CMOS gate array, i.e., Embodiment 1 of the invention.

As shown in FIG. 8, the surface of the substrate 1 is thermally oxidized, thus forming a thin gate oxide film 9, which is about 3 nm to 4 nm thick and which covers the p-type wells 7 and n-type wells 8. Then, as shown in FIG. 9, a photoresist film 41 is formed on the capacitive element region (i.e., the middle part of the substrate 1) and the input/output buffer circuit region (i.e., the right part of the substrate 1). Using the photoresist film 41 as a mask, wet etching is performed, thereby removing that part of the gate oxide film 9 which lies on the fundamental cell region (i.e., the left part of the substrate 1).

Figure 10:
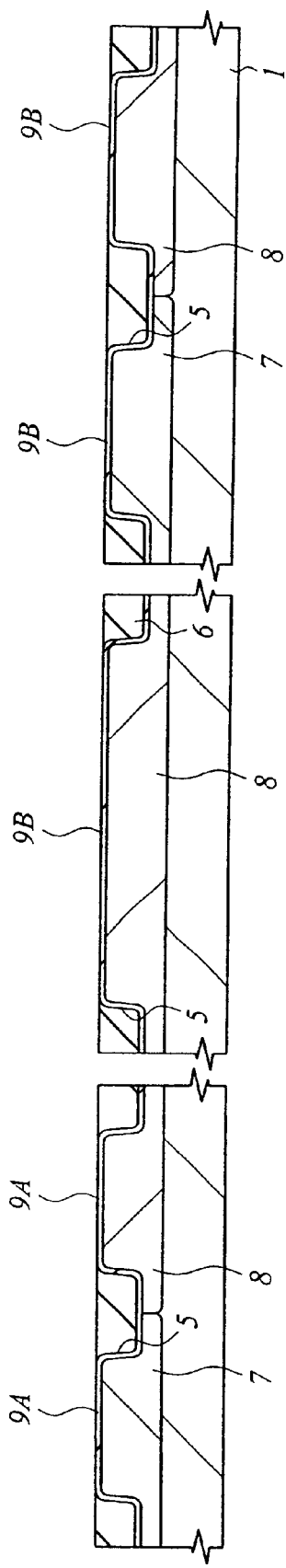
FIG. 10 is a sectional view of a semiconductor substrate, explaining a method of manufacturing the CMOS gate array, i.e., Embodiment 1 of the invention.

The photoresist film 41 is then removed. Thereafter, as shown in FIG. 10, the substrate 1 is thermally oxidized, forming a thin gate oxide film 9A on the p-type well 7 and n-type well 8 of the fundamental cell region. The gate oxide film 9A is about 2.5 nm to 3 nm thick. During the thermal oxidation, the silicon oxide film 9 formed on the substrate 1 (p-type wells 7 and n-type wells 8) of the capacitive element region and input/output buffer circuit region grow into a thick gate oxide film 9B having a thickness of about 6.5 nm. Thereafter, the gate oxide films 9A and 9B may be subjected to nitrization.

Figure 11:
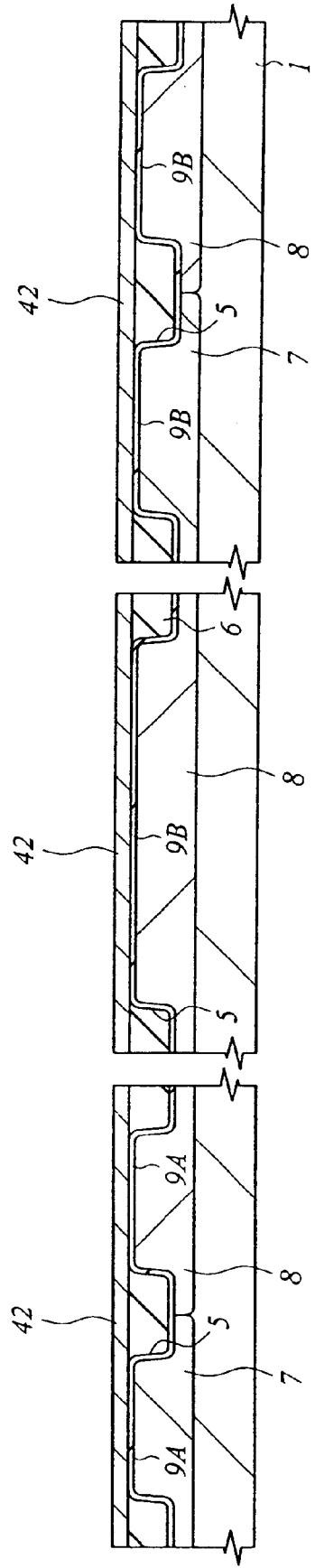
FIG. 11 is a sectional view of a semiconductor substrate, explaining a method of manufacturing the CMOS gate array, i.e., Embodiment 1 of the invention.
Figure 12:
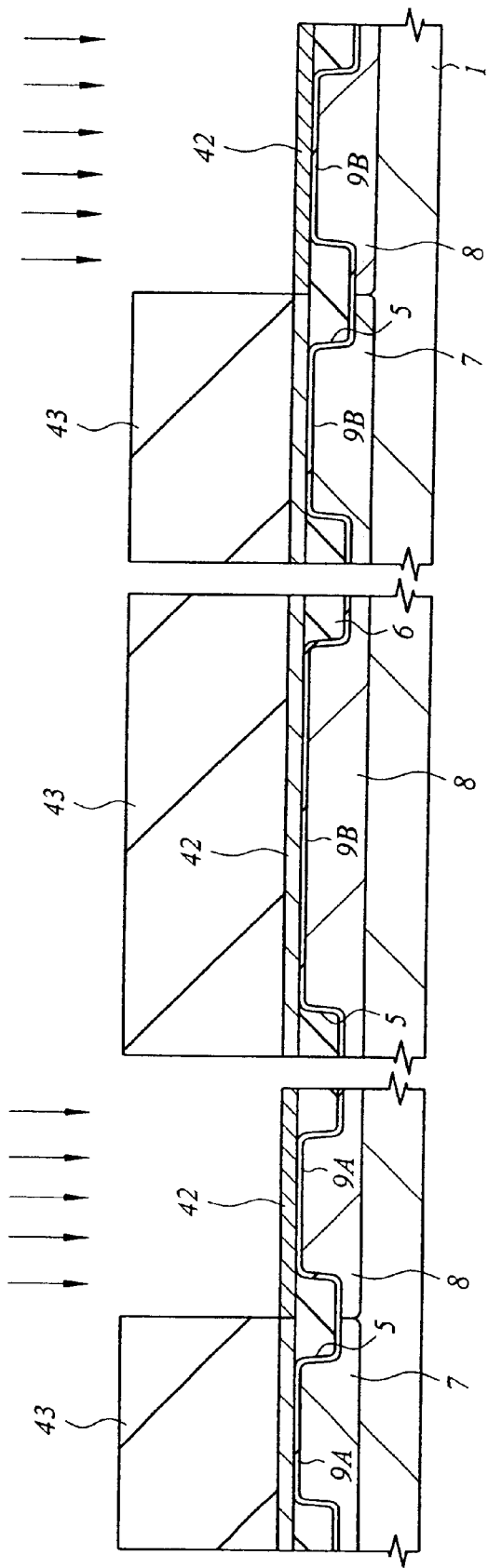
FIG. 12 is a sectional view of a semiconductor substrate, explaining a method of manufacturing the CMOS gate array, i.e., Embodiment 1 of the invention.

Further, as shown in FIG. 11, a polycrystalline silicon film 42 is deposited on the substrate 1 by means of CVD, to a thickness of approximately 70 nm. As shown in FIG. 12, a photoresist film 43 is formed, covering the substrate (p-type well 7) provided in the fundamental cell region, the capacitive element region (including the n-type well 8), and the p-type well 7 provided in the input/output buffer circuit region. Using the photoresist film 43 as a mask, p-type impurities (B) are ion-implanted into those parts of the polycrystalline silicon film 42 which lie on the n-type wells 8 provided in the fundamental cell region and input/output buffer circuit region.

The p-type impurities thus implanted impart p-type conductivity to the gate electrode 10B of the p-channel MISFET $Qp_1$ that constitutes a part of the fundamental cell 2 and to the gate electrode 10D of the p-channel MISFET $QP_4$ that constitutes a part of the input/output buffer circuit 4.

Figure 13:
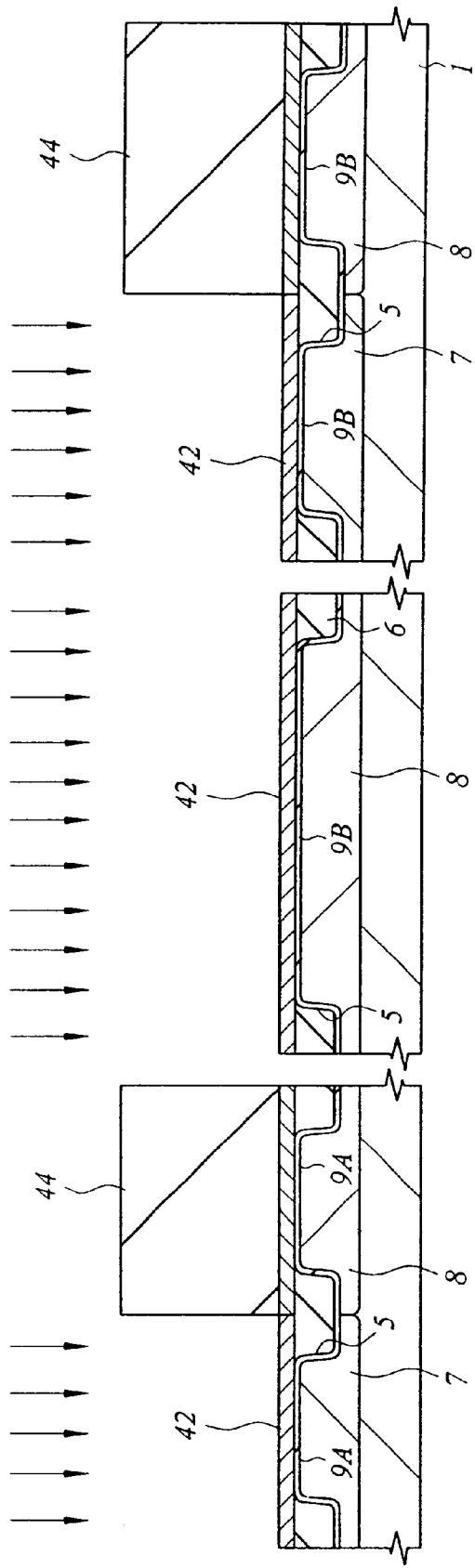
FIG. 13 is a sectional view of a semiconductor substrate, explaining a method of manufacturing the CMOS gate array, i.e., Embodiment 1 of the invention.

Then, the photoresist film 43 is removed. As shown in FIG. 13, a photoresist film 44 is provided, covering the n-type well 8 of the fundamental cell region and the n-type well 8 of the input/output buffer circuit region. Using the photoresist film 44 as a mask, n-type impurities (As) are ion-implanted into the part of the polycrystalline silicon film 42 which lie on the p-type well 7 of the fundamental cell region, the capacitive element region (including the n-type well 8) and the p-type well 7 of the input/output buffer circuit region.

The n-type impurities thus implanted impart n-type conductivity to the gate electrode 10A of the n-channel MISFET $Qn_1$ that constitutes a part of the fundamental cell 2 and to the gate electrode 10C of the n-channel MISFET $Qn_4$ that constitutes a part of the input/output buffer circuit 4. The gate electrode 10E of the capacitive element C, acquires n-type conductivity because of this ion implantation. The p-channel MISFET constituting the element $C_1$, therefore, has its threshold voltage increased (see FIG. 6).

Thus, n-type impurities are introduced into the gate electrode 10E of the capacitive element $C_1$, as the ion implantation is carried out to impart n-type conductivity to the gate electrode 10A of the n-channel MISFET $Qn_1$ that constitutes a part of the fundamental cell 2 and to the gate electrode 10C of the n-channel MISFET $Qn_4$. Therefore, it is not necessary to prepare a photomask or perform ion-implantation in order to introduce n-type impurities into the gate electrode 10E of the capacitive element $C_1$. In other words, n-type impurities can be introduced into the gate electrode 10E of the capacitive element $C_1$, without increasing the number of steps of manufacturing the CMOS gate array.

Figure 14:
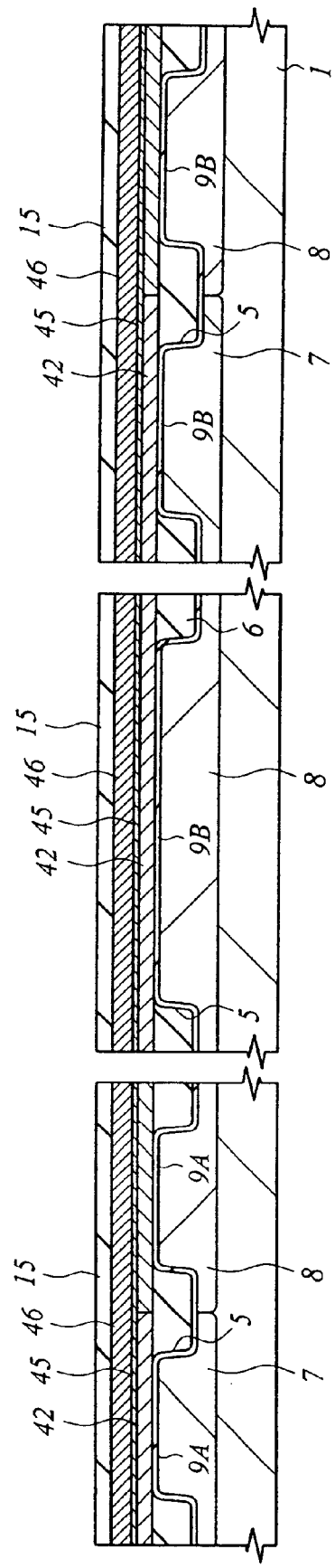
FIG. 14 is a sectional view of a semiconductor substrate, explaining a method of manufacturing the CMOS gate array, i.e., Embodiment 1 of the invention.

Next, as shown in FIG. 14, the photoresist film 44 is removed. Then, a WN film 45 having a thickness of 5 nm is deposited on the polycrystalline silicon film 42 by means of sputtering. Further, a W film 46 having a thickness of about 100 nm is deposited on the WN film 45 by sputtering, too. Still further, a silicon nitride film 15 about 50 nm thick, which is a cap insulating film, is deposited on the W film 46 by means of CVD.

Figure 15:
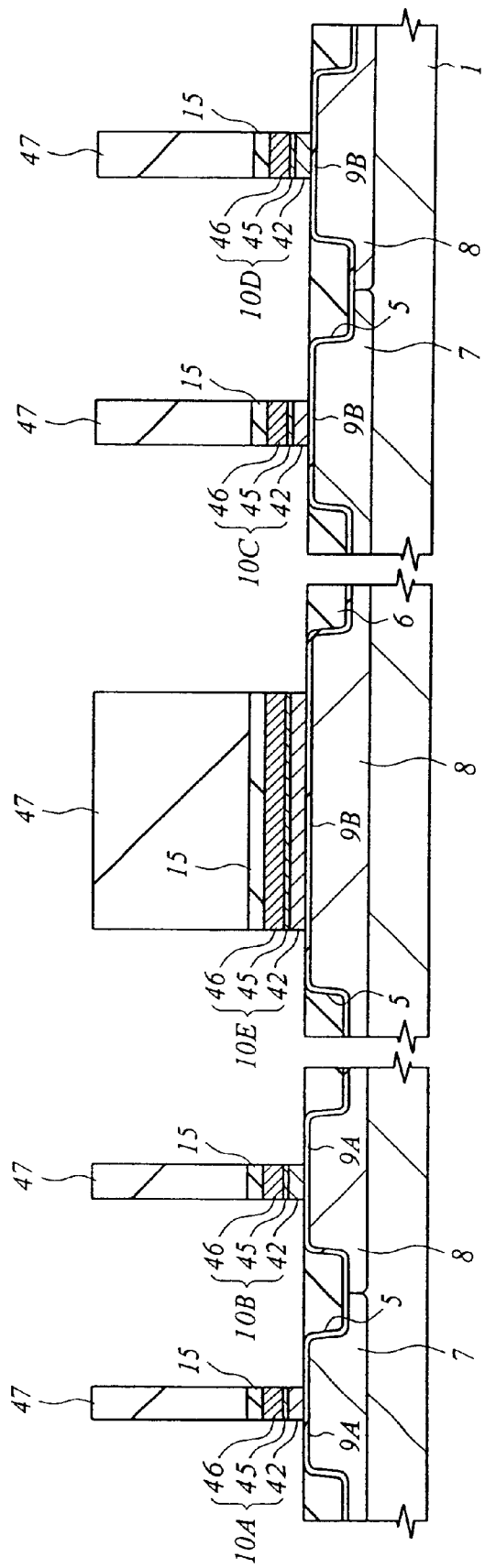
FIG. 15 is a sectional view of a semiconductor substrate, explaining a method of manufacturing the CMOS gate array, i.e., Embodiment 1 of the invention.

As shown in FIG. 15, the nitride film 15, W film 46, WN film 45 and polycrystalline silicon film 42 are dry-etched in the order they are mentioned, by using a photoresist film 47 as a mask. As a result, gate electrodes 10A and 10B are thereby formed on the fundamental cell region, the gate electrodes 10C and 10D are formed on the input/output buffer circuit region, and the gate electrode 10E is formed on the capacitive element region. The gate electrodes 10A to 10E may be made of other material other than poly-metal. For example, they can be made of polycrystalline silicon or a polysilicide film composed of a polycrystalline silicon film and a tungsten silicide (WSi) film laid thereon.

Figure 16:
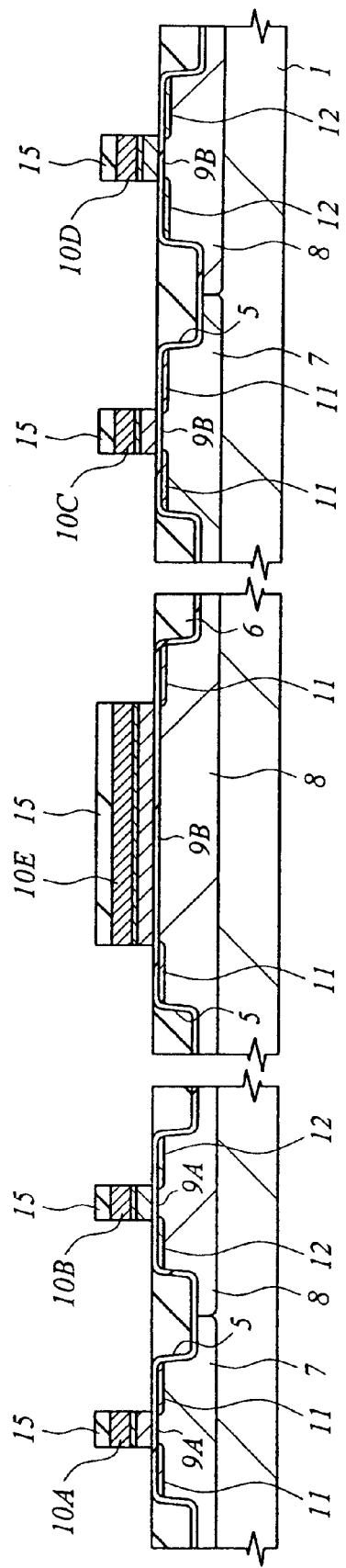
FIG. 16 is a sectional view of a semiconductor substrate, explaining a method of manufacturing the CMOS gate array, i.e., Embodiment 1 of the invention.

Then, as shown in FIG. 16, the photoresist film 47 is removed. P-type impurities (e.g., B) are ion-implanted into the n-type wells 8 provided in the fundamental cell region and input/output buffer circuit region by using a photoresist film (not shown) as a mask. P-type semiconductor regions 12 are thereby formed in the fundamental cell region and input/output buffer circuit region. Further, n-type impurities (e.g., P) are ion-implanted into the p-type well 7 provided in the fundamental cell region, the n-type well 8 provided in the capacitive element region and the p-type well 7 provided in the input/output buffer circuit region. N-type semiconductor regions 11 are thereby formed in these regions. The n-type semiconductor regions 11 and the P-type semiconductor regions 12 are provided to impart LDD (Lightly Doped Drain) structure to the MISFETs ($Qn_1$ $Qp_1$) constituting the fundamental cells 2, the MISFET constituting the constituting the element C, and the MISFETs ($Qn_4$, $QP_4$) constituting the input/output buffer circuits 4.

Figure 17:
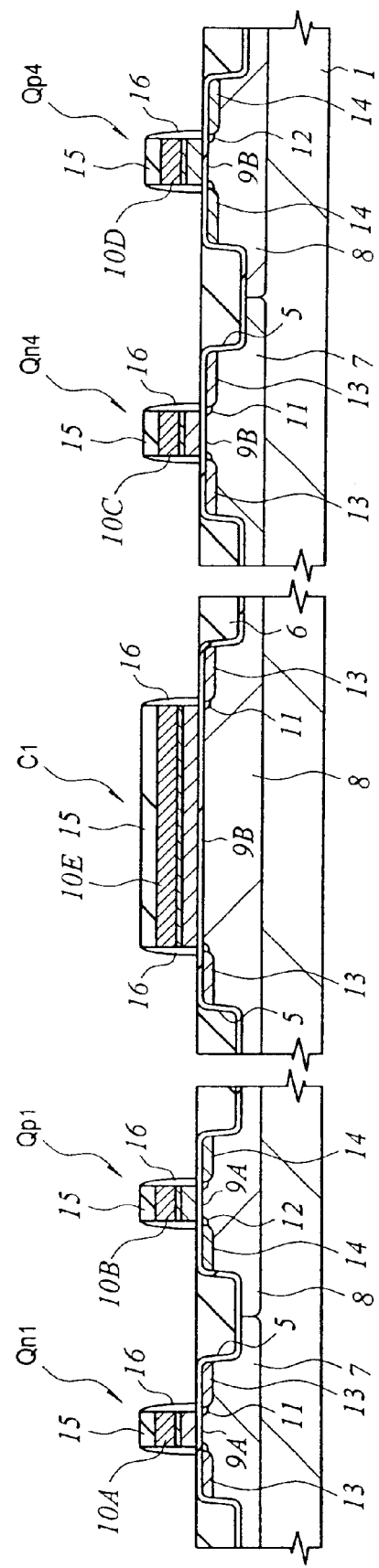
FIG. 17 is a sectional view of a semiconductor substrate, explaining a method of manufacturing the CMOS gate array, i.e., Embodiment 1 of the invention.

As shown in FIG. 17, the silicon nitride film (not shown) deposited on the substrate 1 by, for example, CVD is subjected to an isotropic etching, thereby forming side wall spacers 16 on the sides of the gate electrodes 10A to 10E. Using a photoresist film (not shown) as a mask, p-type impurities (e.g., B) are ion-implanted into the n-type wells 8 provided in the fundamental cell region and input/output buffer circuit region, thereby forming p-type semiconductor regions (sources and drains) 14. Further, n-type impurities (e.g., P) are ion-implanted into the p-type well 7 provided in the fundamental cell region, the n-type well 8 provided in the capacitive element region and the p-type well 7 provided in the input/output buffer circuit region. $N^+$-type semiconductor regions (sources and drains) 13 are thereby formed in these three regions. Having performed all steps described thus far, the MISFETs ($Qn_1$, $Qp_1$) constituting the fundamental cells 2, the MISFETs ($Qn_4$, $QP_4$) constituting the input/output buffer circuits 4, and the capacitive element $C_1$ are formed completely.

Figure 18:
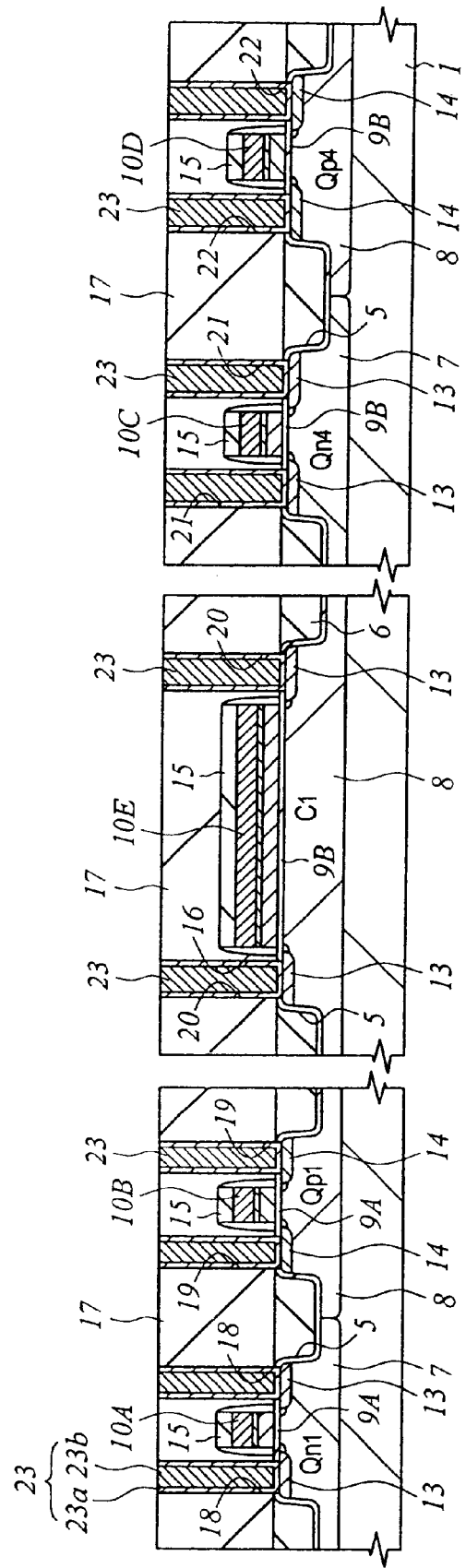
FIG. 18 is a sectional view of a semiconductor substrate, explaining a method of manufacturing the CMOS gate array, i.e., Embodiment 1 of the invention.

As shown in FIG. 18, a silicon oxide film 17 is deposited on the substrate 1 by CVD. Then, the silicon oxide film 17 is subjected to dry etching using a photoresist film (not shown) as a mask. Contact holes 18 to 22 are thereby made in the silicon oxide film 17. Plug electrodes 23 are formed in the contact holes 18 in the following manner. First, a TiN film 23a is deposited by CVD in the contact holes 18 to 22 and on the silicon oxide film 17. Then, a W film 23b is deposited on the TiN film 23a by CVD. Thereafter, those parts of the W film 23b and TiN film 23a that lie outside the contact holes 18 to 22 are removed by means of chemical mechanical polishing.

Figure 19:
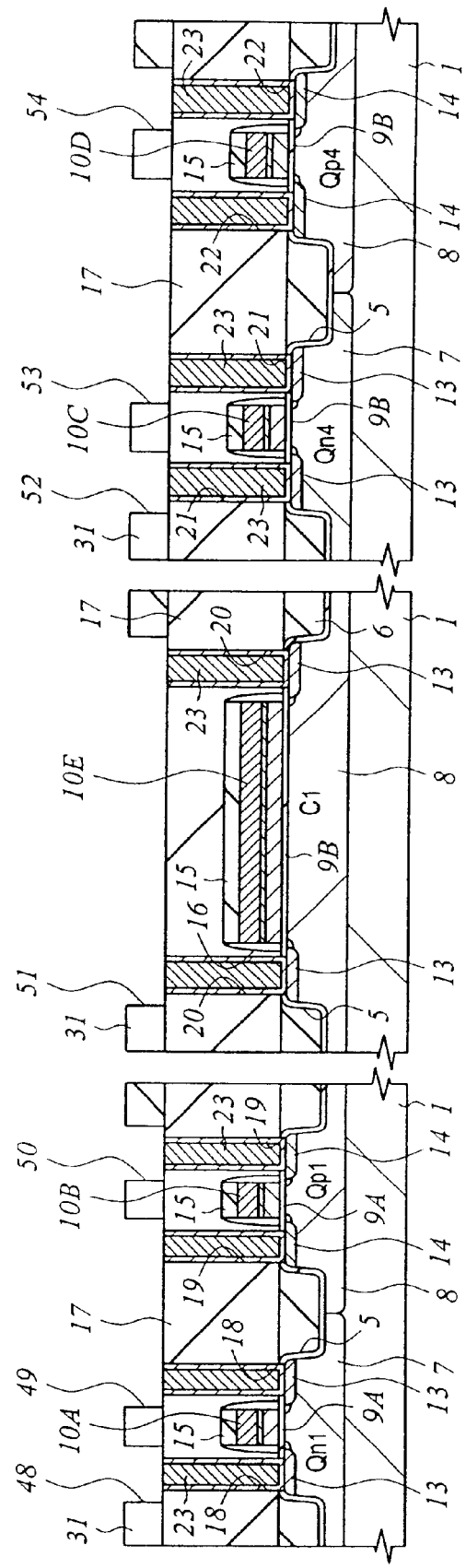
FIG. 19 is a sectional view of a semiconductor substrate, explaining a method of manufacturing the CMOS gate array, i.e., Embodiment 1 of the invention.

As shown in FIG. 19, a silicon oxide film 31 is deposited on the silicon oxide film 17 by means of CVD. The silicon oxide film 31 is subjected to dry etching using a photoresist film (not shown) as a mask, thus making wire trenches 48 to 54 in the silicon oxide film 31.

Thereafter, first-layer wires 24 to 30 are formed in the wire trenches 48 to 54, whereby the CMOS gate array of FIG. 5 is manufactured. More specifically, the first-layer wires 24 to 30 are formed in the following way. First, a TiN film is deposited in the wire trenches 48 to 54 and on the silicon oxide film 31. A W film is then deposited on the TiN film. Those parts of the W film and TiN film which lie outside the wire trenches 48 to 54 are removed by effecting chemical mechanical polishing. Alternatively, the wires 24 to 30 may be formed by forming a TaN film in the wire trenches 48 to 54 and on the silicon oxide film 31, forming a Cu shield film on the TaN film, forming a Cu film by means of, for example, plating, and removing the Cu shield film and the Cu film by chemical mechanical polishing.

In Embodiment 1, the oxide film 9B constituting a part of the capacitive element $C_1$ provided in the PLL circuit 3 is as thick as the gate oxide films 9B of the MISFETs ($Qn_4$, $QP_4$) constituting the input/output buffer circuits 4. The capacitive element $C_1$, therefore, has but a small leakage current even if the components of the CMOS gate array are made small.

Moreover, in Embodiment 1, the capacitive element $C_1$ can be formed, without increasing the number of masks and steps of ion-implantation.

Embodiment 2

Figure 20:
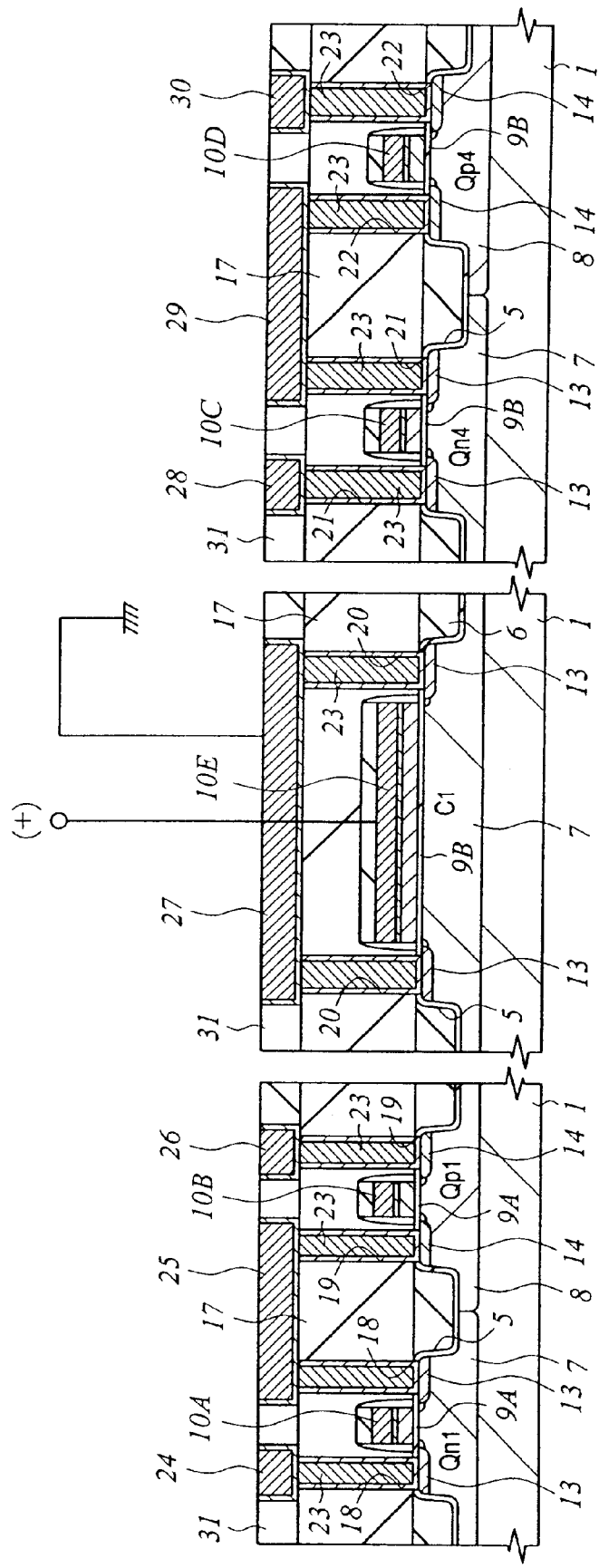
FIG. 20 is a sectional view of a semiconductor substrate, explaining a method of manufacturing a CMOS gate array that is Embodiment 2 of the present invention.

The capacitive element $C_1$ provided in the PLL circuit 3 may comprise such an n-channel MISFET as illustrated in FIG. 20. The capacitive element $C_1$ shown in FIG. 20 is formed in a p-type well 7 of a substrate 1. This capacitive element $C_1$ is composed of mainly a gate oxide film 9B, a gate electrode 10E, and n-type semiconductor region 13.

The oxide film 9B of the capacitive element $C_1$ is as thick as the gate oxide films 9B of MISFETs ($Qn_4$, $QP_4$) constituting an input/output buffer circuit 4. That is, it is, for example, about 6.5 nm thick. The p-type well 7 is doped with n-type impurities (e.g., As) so that the n-channel MISFETs have a lower threshold voltage than the other n-channel MISFET $Qn_4$. Hence, the capacitive element $C_1$ can reliably operate even at a low power-supply voltage.

Figure 21:
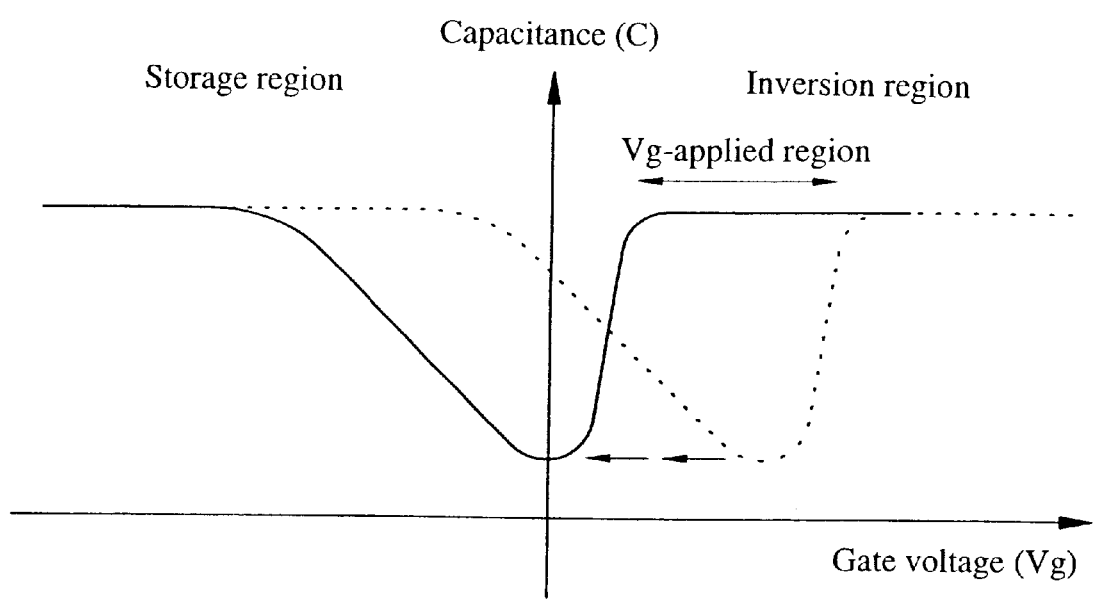
FIG. 21 is a graph illustrating the Vg-C characteristic of a capacitive element comprising an n-channel MISFET.

FIG. 21 is a graph illustrating the Vg-C characteristic of the capacitive element $C_1$ comprising an n-channel MISFET.

As described above, the capacitive element $C_1$ has the oxide film 9B that is as thick as the gate oxide films 9B of MISFETs ($Qn_4$, $QP_4$) constituting an input/output buffer circuit 4. The leakage current of the capacitive element $C_1$ is, therefore, smaller than that of a capacitive element having a thin gate oxide film 9A. The storage region of a p-channel MISFET may be used as a capacitive element. In this case, however, the threshold voltage of the p-channel MISFET increases due to the thick gate oxide film. Inevitably, the capacitive element cannot have a stable capacitance in the low region of the gate input voltage as indicated by the broken line in FIG. 21. This is why the p-type well 7 is doped with n-type impurities (e.g., As), thus lowering the threshold voltage of the n-channel MISFET in Embodiment 2 of this invention. This enables the capacitive element C, to acquire a stable capacitance in not only the high region of the gate input voltage but also the low region thereof, as indicated by the solid line in FIG. 21.

A method of manufacturing the capacitive element $C_1$ comprising an n-channel MISFET according to Embodiment 2 will be described, with reference to FIG. 22 to 25.

Figure 22:
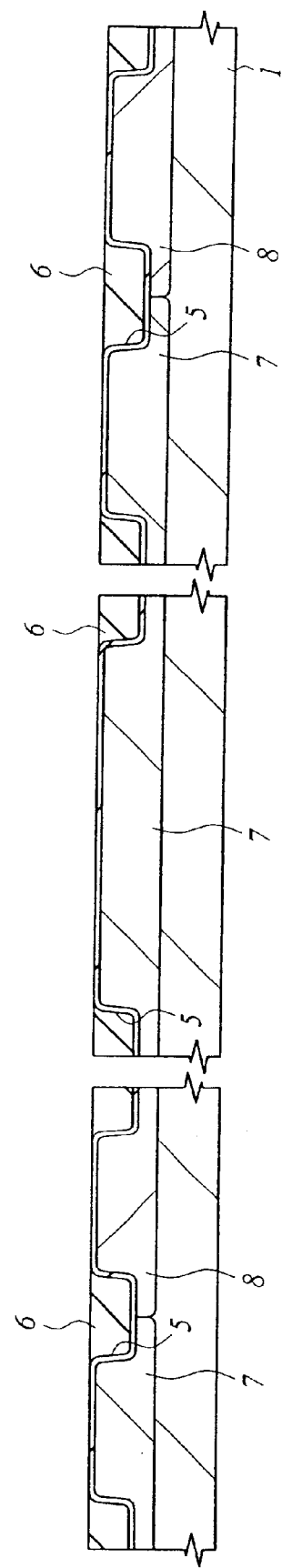
FIG. 22 is a sectional view of the semiconductor substrate, explaining the method of manufacturing the CMOS gate array that is Embodiment 2 of the invention.

First, as shown in FIG. 22, element-isolating trenches 5 are made in the surface of the substrate 1. Next, n-type impurities (e.g., phosphorus, P) are ion-implanted into parts of the substrate 1 and p-type impurities (e.g., B) are ion-implanted into other parts of the substrate 1, by using a photoresist film (not shown) as a mask. Thereafter, the substrate 1 is heat-treated, diffusing the n-type impurities and the p-type impurities. P-type wells 7 and n-type wells 8 are thereby formed in the surface of the substrate 1. In the present instance, a p-type well 7 is formed in the capacitive element region of the substrate 1.

Figure 23:
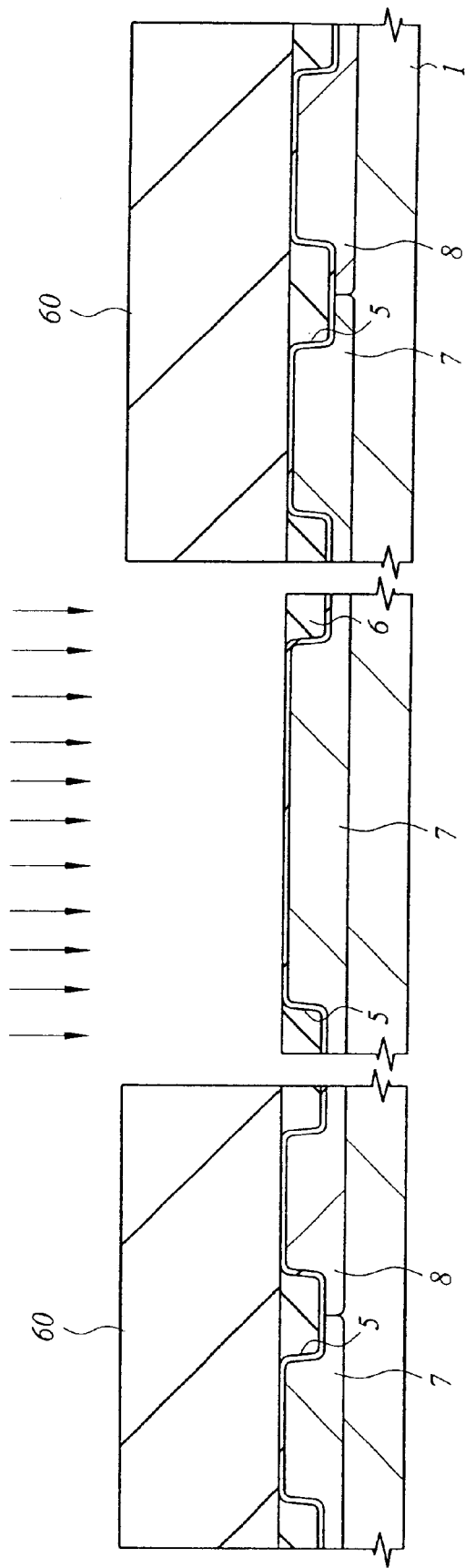
FIG. 23 is a sectional view of the semiconductor substrate, explaining the method of manufacturing the CMOS gate array that is Embodiment 2 of the invention.

Next, as shown in FIG. 23, a photoresist film 60 is formed, covering the fundamental cell region and input/output buffer regions of the substrate 1. Then, n-type impurities (As) are ion-implanted into the p-type well 7 provided in the capacitive element region of the substrate 1, in order to lower the threshold voltage of the n-channel MISFET that constitutes the capacitive element $C_1$.

Figure 24:
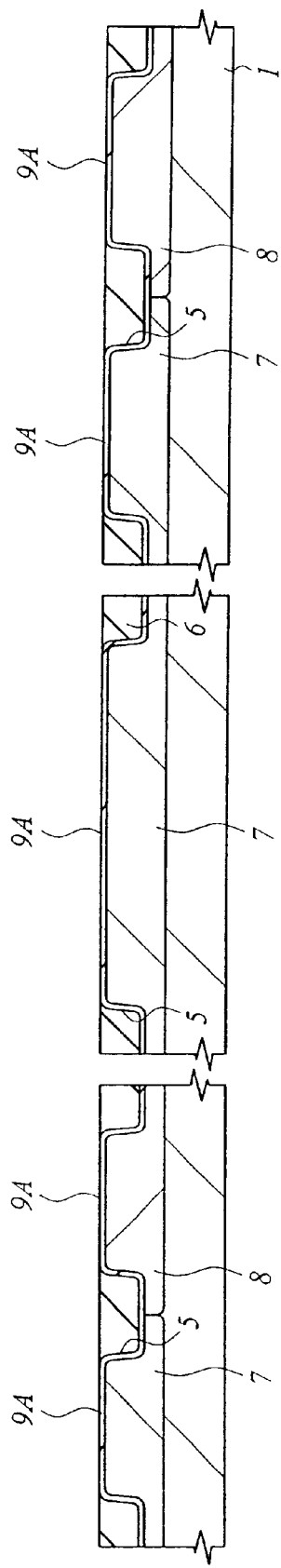
FIG. 24 is a sectional view of the semiconductor substrate, explaining the method of manufacturing the CMOS gate array that is Embodiment 2 of the invention.

The photoresist film 60 is removed as shown in FIG. 24. Thereafter, the substrate 1 is thermally oxidized. A thin gate oxide film 9A, about 2.5 nm to 3 nm thick, is thereby formed on the p-type well 7 and n-type well 8 that are provided in the fundamental cell region of the substrate 1.

Figure 25:
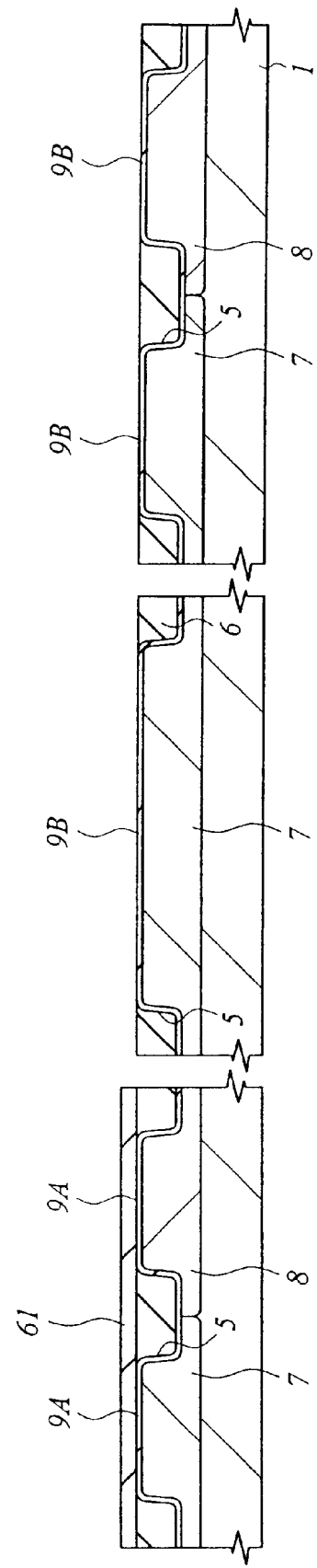
FIG. 25 is a sectional view of the semiconductor substrate, explaining the method of manufacturing the CMOS gate array that is Embodiment 2 of the invention.

As shown in FIG. 25, an oxidation-resistant insulating film 61 made of silicon nitride or the like is formed, covering the p-type well 7 and n-type well 8 provided in the fundamental cell region. The substrate 1 is subjected to thermal oxidation. During the thermal oxidation, the silicon oxide film 9A provided on the p-type wells 7 and n-type wells 8 of the capacitive element region and input/output buffer circuit region, grow into a thick gate oxide film 9B having a thickness of about 6.5 nm. It should be noted that the gate oxide films 9A and 9B, which differ in thickness, may be formed in the same method as in Embodiment 1 described above.

Thereafter, the insulating film 61 is removed from the fundamental cell region. Manufacturing steps identical to those shown in FIGS. 11 to 17 (Embodiment 1) are carried out, thereby forming MISFETs ($Qn_1$, $Qp_1$) constituting fundamental cells 2 and MISFETs ($Qn_4$, $QP_4$) constituting an input/output buffer circuit 4, and a capacitive element $C_1$.

In Embodiment 2, too, the n-channel MISFET constituting the capacitive element $C_1$ has a gate oxide film 9B that has the same thickness as that of the MISFETs ($Qn_4$, $QP_4$) constituting the input/output buffer circuit 4. Hence, the leakage current of the capacitive element $C_1$ can be decreased.

In Embodiment 2, ion implantation must be performed and a photomask must be used in order to adjust the threshold voltage of the n-channel MISFET that constitutes the capacitive element $C_1$ provided in the p-type well 7 (see FIG. 23). Nonetheless, the capacitive element $C_1$ can acquire a more stable capacitance than a capacitive element formed by using the storage region of a p-channel MISFET.

Embodiment 3

Figure 26:
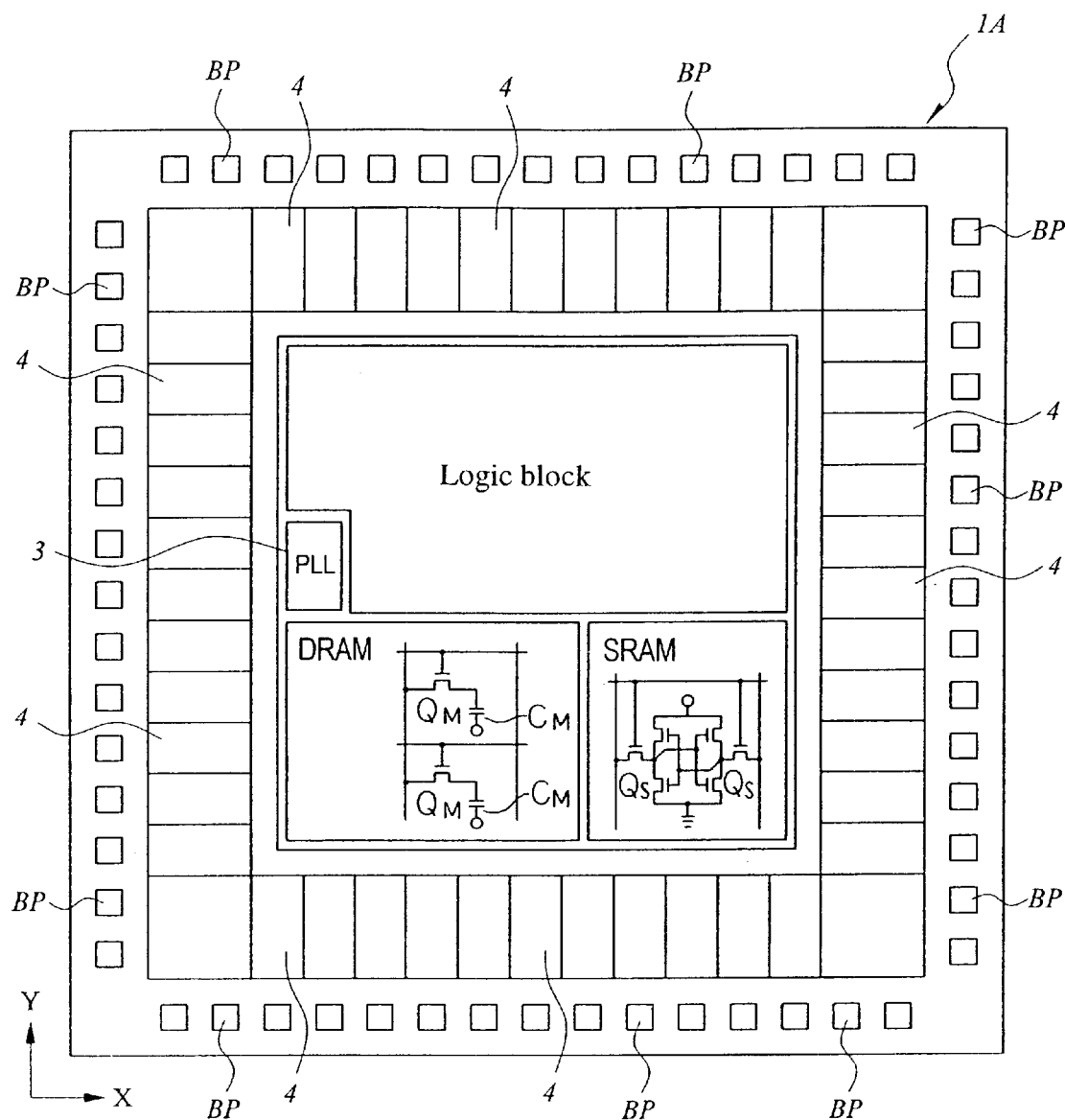
FIG. 26 is a plan view of a semiconductor chip which is Embodiment 3 of the invention and which has standard cells.

Embodiments 1 and 2 described above are CMOS gate arrays. Nevertheless, the present invention can be applied to such an LSI of standard-cell system as shown in FIG. 26, designed for a particular use and having macro cells such a logic block, a DRAM (Dynamic Random Access Memory) and a SRAM (Static Random Access Memory). In this case, too, the capacitive elements incorporated in an analog PLL circuit may have gate oxide films 9B that are as thick as the gate oxide films of the MISFETs that constitute an input/output buffer circuit 4 and the gate oxide films of the MISFETs $Q_m$ and $Q_s$ that constitute the memory cells of the DRAM and SRAM. Thus, the same advantages can be attained as in Embodiment 1.

The present invention can be applied to not only gate arrays and standard cells, but also to various types of LSIs, such as a microcomputer, which has circuits each composed of two or more kinds of MISFETs that differ in the thickness of gate oxide film. In the case of a microcomputer, the capacitive elements provided in the analog PLL circuit may be formed by using a gate oxide film 9B as thick as that of the MISFETs that constitute the input/output buffer circuit and the memory circuit, not by using the gate oxide films 9A of the MISFETs that constitute the microprocessor unit.

The capacitive elements according to this invention are not limited to those used as analog circuit elements in an analog PLL circuit. Rather, they can be capacitive elements C2 that are connected on the power-supply lines (Vdd, Vss) of analog circuits or digital circuits, as is illustrated in FIG. 27, for the purpose of reducing noise. Furthermore, they can be such filtering capacitive elements $C_3$ as is illustrated in FIG. 28.

Capacitive elements made by using the thick oxide film 9B can have a small leakage current, but the capacitance they acquire per unit area is smaller than the capacitance of a capacitive element made by using the thin oxide film 9A. It is therefore necessary to use a thick gate oxide film or a thin gate oxide film to form a capacitive element, in accordance with the intended use of the capacitive element.

Figure 29A:
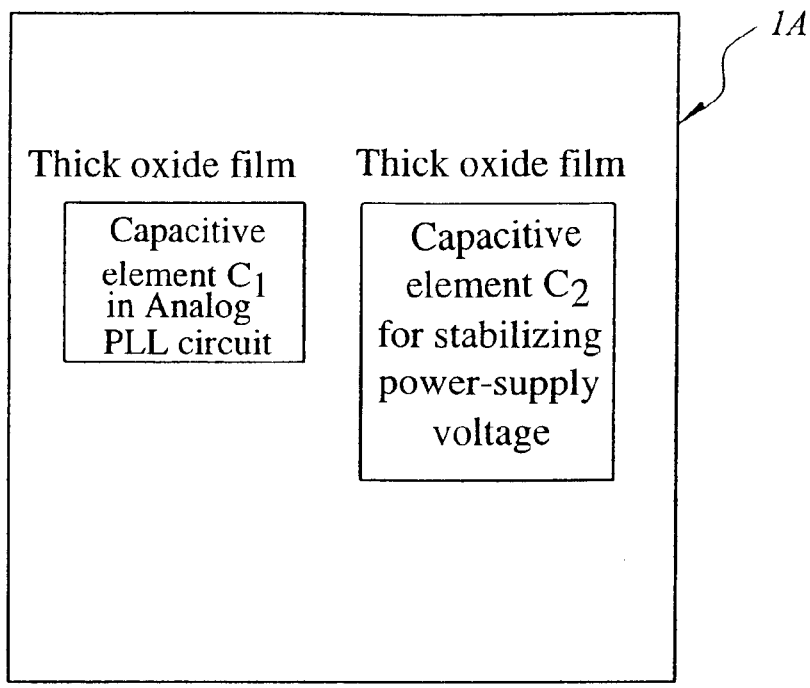

In a semiconductor chip that has a large chip area as shown in FIG. 29(a) and consumes much power, the capacitive elements $C_1$ provided in the analog PLL circuit and the capacitive elements $C_2$ provided to stabilize the power-supply voltage are made by using a thick gate oxide film 9B. In this case, the capacitive elements $C_1$ incorporated in the analog PLL circuit are composed of p-channel MISFETs to acquire stable capacitance even at a low voltage. By contrast, the capacitive elements $C_2$ for stabilizing the power-supply voltage may be composed of either p-channel MISFETs or n-channel MISFETS, because their gate electrodes are fixed at the power-supply voltage (Vdd).

Figure 29B:
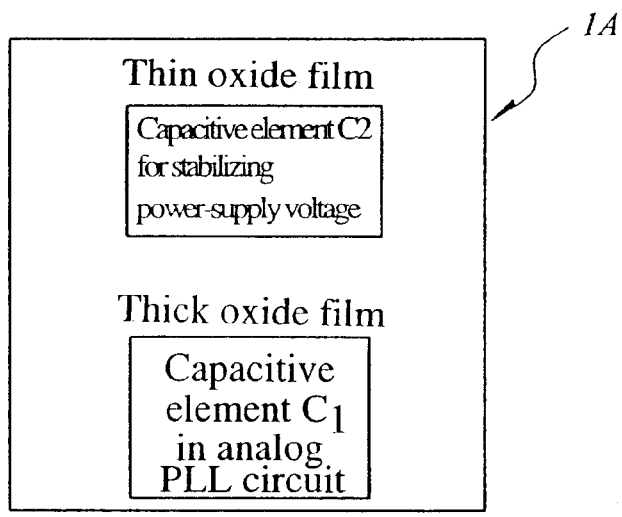

In a semiconductor chip that has a small chip area as shown in FIG. 29(b) and does not consumes so much power, only the capacitive elements $C_1$ provided in the analog PLL circuit are constituted by p-channel MISFETs having a thick gate oxide film 9B, because the leakage current of the elements $C_1$ should otherwise increase. The capacitive elements $C_2$ provided to stabilize the power-supply voltage are made by using a thin gate oxide film 9A, so as to have their area reduced. In this case, too, the capacitive elements $C_2$ for stabilizing the power-supply voltage may be composed of either p-channel MISFETs or n-channel MISFETS, because their gate electrodes are fixed at the power-supply voltage (Vdd).

The embodiments of the present invention have been described in detail. This does not mean, however, that the invention is limited to these embodiments. Various changes and modifications can be made, without departing from the scope and spirit of the invention.

Some of the various advantages achieved by this invention are as follows:

(1) The leakage current of the capacitive element constituted by a MISFET can be decreased, so that the capacitive element may operate reliably.

(2) A capacitive element that can operate reliably even at a low power-supply voltage can be formed, without increasing the number of steps of manufacturing the semiconductor integrated circuit that incorporates the capacitive element.

What is claimed is:

1. A semiconductor integrated circuit device comprising:
a first MISFET, a first capacitive element and a second capacitive element each having a first gate insulating film and a first gate electrode formed on said first gate insulating film,
wherein said first capacitive element is provided in a circuit, and
wherein said second capacitive element is provided as a capacitor for stabilizing a power-supply voltage; and
a second MISFET having a second gate insulating film which has a thickness less than that of said first gate insulating film,
wherein said first gate insulating film of said first capacitive element is formed on a first well region formed in a semiconductor substrate such that said first well region serves as one of two electrodes of said first capacitive element,
wherein said first gate electrode of said first capacitive element serves as the other of said two electrodes of said first capacitive element,
wherein said first gate insulating film of said second capacitive element is formed on a second well region formed in said semiconductor substrate such that said second well region serves as one of two electrodes of said second capacitive element, and
wherein said first gate electrode of said second capacitive element serves as the other of said two electrodes of said second capacitive element.

2. A semiconductor integrated circuit device according to claim 1, wherein said circuit is a phase-locked loop circuit.

3. A semiconductor integrated circuit device according to claim 1, further comprising:
- a third MISFET for a memory cell having a third gate insulating film which has a thickness larger than that of said second gate insulating film,
- wherein said third MISFET is provided in said memory cell of a random access memory.

4. A semiconductor integrated circuit device comprising:
- a first MISFET, a second MISFET for a memory cell and a first capacitive element each having a first gate insulating film and a first gate electrode formed on said first gate insulating film; and
- a third MISFET having a second gate insulating film which has a thickness less than that of said first gate insulating film,
- wherein said first gate insulating film of said first capacitive element is formed on a first well region formed in a semiconductor substrate such that said first well region serves as one of two electrodes of said first capacitive element, and
- wherein said first gate electrode of said first capacitive element serves as the other of said two electrodes of said first capacitive element.

5. A semiconductor integrated circuit device according to claim 4, wherein said first MISFET constitutes at least one of an input MISFET and an output MISFET.

6. A semiconductor integrated circuit device according to claim 4, wherein said second MISFET is provided in said memory cell of a random access memory.

7. A semiconductor integrated circuit device according to claim 4, wherein said third MISFET is provided in a microprocessor unit.

8. A semiconductor integrated circuit device comprising:
- a first MISFET and a first capacitive element each having a first gate insulating film and a first gate electrode formed on said first gate insulating film;
- a second MISFET for a logic circuit having a second gate insulating film which has a thickness less than that of said first gate insulating film; and
- a third MISFET for a memory cell having a third gate insulating film which has a thickness larger than that of said second gate insulating film,
- wherein said first gate insulating film of said first capacitive element is formed on a first well region formed in a semiconductor substrate such that said first well region serves as one of two electrodes of said first capacitive element, and
- wherein said first gate electrode of said first capacitive element serves as the other of said two electrodes of said first capacitive element.

9. A semiconductor integrated circuit device according to claim 8, wherein said first MISFET constitutes at least one of an input MISFET and an output MISFET.

10. A semiconductor integrated circuit device according to claim 8, wherein said third MISFET is provided in said memory cell of a random access memory.

11. A semiconductor integrated circuit device according to claim 8, wherein said second MISFET is provided in a microprocessor unit.

12. A semiconductor integrated circuit device according to claim 8, further comprising:
- a fourth MISFET for a memory cell having a fourth gate insulating film which has a thickness larger than that of said second gate insulating film,
- wherein said fourth MISFET is provided in said memory cell of a static random access memory, and
- wherein said third MISFET is provided in said memory cell of a dynamic random access memory.

13. A semiconductor integrated circuit device according to claim 8, wherein said first capacitive element is provided in an analog circuit, and further comprising:
- a second capacitive element having said first gate insulating film and provided as a capacitor for stabilizing a power-supply voltage.

14. A semiconductor integrated circuit device comprising:
- a first MISFET, a first capacitive element and a MISFET type element each having a first gate insulating film and a first gate electrode formed on said first gate insulating film; and
- a second MISFET having a second gate insulating film which has a thickness less than that of said first gate insulating film,
- wherein said first gate insulating film of said first capacitive element is formed on a first well region formed in a semiconductor substrate such that said first well region serves as one of two electrodes of said first capacitive element, and
- wherein said first gate electrode of said first capacitive element serves as the other of said two electrodes of said first capacitive element.

15. A semiconductor integrated circuit device according to claim 14, wherein said MISFET type element constitutes a MISFET for a memory cell.

16. A semiconductor integrated circuit device according to claim 14,
- wherein said MISFET type element constitutes a second capacitive element serving as a capacitor for stabilizing a power-supply voltage, and
- wherein said first capacitive element is included in an analog circuit.

17. A semiconductor integrated circuit device comprising:
- a first MISFET and a first capacitive element each having a first gate insulating film and a first gate electrode formed on said first gate insulating film; and
- a second MISFET and a second capacitive element each having a second gate insulating film which has a thickness less than that of said first gate insulating film and a second gate electrode formed thereon,
- wherein said first capacitive element is included in a circuit,
- wherein said second capacitive element serves as a capacitor for stabilizing a power-supply voltage,
- wherein said first gate insulating film of said first capacitive element is formed on a first well region formed in a semiconductor substrate such that said first well region serves as one of two electrodes of said first capacitive element,
- wherein said first gate electrode of said first capacitive element serves as the other of said two electrodes of said first capacitive element,
- wherein said second gate insulating film of said second capacitive element is formed on a second well region formed in said semiconductor substrate such that said second well region serves as one of two electrodes of said second capacitive element, and
- wherein said second gate electrode of said second capacitive element serves as the other of said two electrodes of said second capacitive element.

18. A semiconductor integrated circuit device according to claim 17, wherein said circuit is a phase-locked loop circuit.

19. A semiconductor integrated circuit device according to claim 17,
wherein a source and a drain region of said first capacitive element are formed in said first well region and have the same conductivity type as said first well region,
wherein a source and a drain region of said second capacitive element are formed in said second well region and have the same conductivity type as said second well region, and
wherein said second well region has a conductivity type opposite to that of said first well region.

20. A semiconductor integrated circuit device according to claim 17, further comprising:
a third MISFET for a memory cell having a third gate insulating film which has a thickness larger than that of said second gate insulating film,
wherein said third MISFET is provided in said memory cell of a random access memory.

21. A semiconductor integrated circuit device comprising:
a first MISFET and a first capacitive element each having a first gate insulating film and a first gate electrode formed on said first gate insulating film,
wherein said first MISFET is operated at a first operating voltage, and
wherein said first capacitive element is provided in a phase-locked loop circuit; and
a second MISFET having a second gate insulating film which has a thickness less than that of said first gate insulating film and a second gate electrode formed thereon,
wherein said second MISFET is operated at a second operating voltage, lower than said first operating voltage,
wherein said first gate insulating film of said first capacitive element is formed on a first well region formed in a semiconductor substrate such that said first well region serves as one of two electrodes of said first capacitive element, and
wherein said first gate electrode of said first capacitive element serves as the other of said two electrodes of said first capacitive element.

22. A semiconductor integrated circuit device according to claim 21, wherein said first MISFET constitutes at least one of an input MISFET and an output MISFET.

23. A semiconductor integrated circuit device according to claim 21, wherein said first MISFET is provided in a memory cell.

24. A semiconductor integrated circuit device according to claim 21, further comprising:
a second capacitive element having a corresponding said second gate insulating film and a corresponding said second gate electrode formed on said second gate insulating film corresponding thereto,
wherein said second capacitive element is provided as a capacitor for stabilizing a power-supply voltage,
wherein said second gate insulating film of said second capacitive element is formed on a second well region formed in said semiconductor substrate such that said second well region serves as one of two electrodes of said second capacitive element, and
wherein said second gate electrode of said second capacitive element serves as the other of said two electrodes of said second capacitive element.

25. A semiconductor integrated circuit device according to claim 21, further comprising:
a second capacitive element having a corresponding said first gate insulating film and a corresponding said first gate electrode formed on said first gate insulating film corresponding thereto,
wherein said second capacitive element is provided as a capacitor for stabilizing a power-supply voltage,
wherein said first gate insulating film of said second capacitive element is formed on a second well region formed in said semiconductor substrate such that said second well region serves as one of two electrodes of said second capacitive element, and
wherein said first gate electrode of said second capacitive element serves as the other of said two electrodes of said second capacitive element.

26. A semiconductor integrated circuit device comprising:
a first MISFET and a first capacitive element each having a first gate insulating film and a first gate electrode formed on said first gate insulating film,
wherein said first MISFET is operated at a first operating voltage,
wherein said first capacitive element is provided in an analog circuit, and
wherein said first capacitive element is designed such that leakage current thereof is suppressed; and
a second MISFET having a second gate insulating film which has a thickness less than that of said first gate insulating film,
wherein said second MISFET is operated at a second operating voltage, lower than said first operating voltage,
wherein said first gate insulating film of said first capacitive element is formed on a first well region formed in a semiconductor substrate such that said first well region serves as one of two electrodes of said first capacitive element, and
wherein said first gate electrode of said first capacitive element serves as the other of said two electrodes of said first capacitive element.

27. A semiconductor integrated circuit device according to claim 26, wherein said first MISFET constitutes at least one of an input MISFET and an output MISFET.

28. A semiconductor integrated circuit device according to claim 26, wherein said first MISFET is provided in a memory cell.

29. A semiconductor integrated circuit device comprising:
a first MISFET and a first capacitive element each having a first gate insulating film and a first gate electrode formed on said first gate insulating film,
wherein said first MISFET is operated at a first operating voltage and constitutes at least one of an input MISFET and an output MISFET, and
wherein said first capacitive element is provided in a phase-locked loop circuit; and
a second MISFET having a second gate insulating film which has a thickness less than that of said first gate insulating film,
wherein said second MISFET is operated at a second operating voltage, lower than said first operating voltage, and is provided in a microprocessor unit,
wherein said first gate insulating film of said first capacitive element is formed on a first well region formed in a semiconductor substrate such that said first well region serves as one of two electrodes of said first capacitive element, and wherein said first gate electrode of said first capacitive element serves as the other of said two electrodes of said first capacitive element.

30. A semiconductor integrated circuit device comprising:

a first MISFET and a first capacitive element each having a first gate insulating film and a first gate electrode formed on said first gate insulating film, wherein said first MISFET is operated at a first operating voltage and constitutes at least one of an input MISFET and an output MISFET, and wherein said first capacitive element is provided in a analog circuit; and a second MISFET having a second gate insulating film which has a thickness less than that of said first gate insulating film, wherein said second MISFET is operated at a second operating voltage, lower than said first operating voltage, and is provided in a microprocessor unit, wherein said first gate insulating film of said first capacitive element is formed on a first well region formed in a semiconductor substrate such that said first well region serves as one of two electrodes of said first capacitive element, and wherein said first gate electrode of said first capacitive element serves as the other of said two electrodes of said first capacitive element.

* * * * *